US010388584B2

(12) United States Patent
Pagaila et al.

(10) Patent No.: US 10,388,584 B2
(45) Date of Patent: Aug. 20, 2019

(54) SEMICONDUCTOR DEVICE AND METHOD OF FORMING FO-WLCSP WITH RECESSED INTERCONNECT AREA IN PERIPHERAL REGION OF SEMICONDUCTOR DIE

(75) Inventors: Reza A. Pagaila, Singapore (SG); Byung Tai Do, Singapore (SG); Linda Pei Ee Chua, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 812 days.

(21) Appl. No.: 13/225,683

(22) Filed: Sep. 6, 2011

(65) Prior Publication Data

US 2013/0056867 A1  Mar. 7, 2013

(51) Int. Cl.
*H01L 23/31* (2006.01)
*H01L 21/56* (2006.01)
(Continued)

(52) U.S. Cl.
CPC ........ *H01L 23/3128* (2013.01); *H01L 21/561* (2013.01); *H01L 21/563* (2013.01); *H01L 21/565* (2013.01); *H01L 21/568* (2013.01); *H01L 23/3114* (2013.01); *H01L 23/3121* (2013.01); *H01L 23/3135* (2013.01); *H01L 23/3185* (2013.01); *H01L 23/49816* (2013.01); *H01L 23/5389* (2013.01); *H01L 24/19* (2013.01); *H01L 24/20* (2013.01); *H01L 24/24* (2013.01); *H01L 24/82* (2013.01); *H01L 24/96* (2013.01); *H01L 24/97* (2013.01); *H01L 25/0657* (2013.01); *H01L 25/105* (2013.01); *H01L 25/50* (2013.01); *H01L 23/295* (2013.01); *H01L 24/73* (2013.01); *H01L 25/03* (2013.01); *H01L 2224/04105* (2013.01); *H01L 2224/12105* (2013.01); *H01L 2224/16225* (2013.01); *H01L 2224/24145* (2013.01); *H01L 2224/32145* (2013.01); *H01L 2224/32225* (2013.01);
(Continued)

(58) Field of Classification Search
CPC . H01L 23/5389; H01L 24/97; H01L 25/0657; H01L 24/20; H01L 21/56
USPC ........................................................ 257/678
See application file for complete search history.

(56) References Cited

U.S. PATENT DOCUMENTS 6,159,770 A * 12/2000 Tetaka et al. ................. 438/112
6,255,740 B1 * 7/2001 Tsuji et al. .................... 257/792
(Continued)

Primary Examiner — Zandra V Smith
Assistant Examiner — Abbigale A Boyle
(74) Attorney, Agent, or Firm — Robert D. Atkins; Patent Law Group: Atkins and Associates, P.C.

(57) ABSTRACT

A semiconductor device has a temporary layer, such as a dam material or adhesive layer, formed over a carrier. A plurality of recesses is formed in the temporary layer. A first semiconductor die is mounted within the recesses of the temporary layer. An encapsulant is deposited over the first semiconductor die and temporary layer. The encapsulant extends into the recesses in the temporary layer. The carrier and temporary layer are removed to form recessed interconnect areas around the first semiconductor die. Alternatively, the recessed interconnect areas can be formed the carrier or encapsulant. Multiple steps can be formed in the recesses of the temporary layer. A conductive layer is formed over the first semiconductor die and encapsulant and into the recessed interconnect areas. A second semiconductor die can be mounted on the first semiconductor die. The semiconductor device can be integrated into PiP and Fi-PoP arrangements.

19 Claims, 28 Drawing Sheets

(51) Int. Cl.
    *H04B 1/00*           (2006.01)
    *H04B 7/14*           (2006.01)
    *H01L 23/00*          (2006.01)
    *H01L 23/498*        (2006.01)
    *H01L 23/538*        (2006.01)
    *H01L 25/065*        (2006.01)
    *H01L 25/00*          (2006.01)
    *H01L 25/10*          (2006.01)
    *H01L 23/29*          (2006.01)
    *H01L 25/03*          (2006.01)

(52) U.S. Cl.
    CPC ............ *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/97* (2013.01); *H01L 2225/0651* (2013.01); *H01L 2225/06524* (2013.01); *H01L 2225/06568* (2013.01); *H01L 2225/06582* (2013.01); *H01L 2225/1023* (2013.01); *H01L 2225/1058* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15192* (2013.01); *H01L 2924/15311* (2013.01); *H01L 2924/181* (2013.01); *H01L 2924/1815* (2013.01); *H01L 2924/18162* (2013.01); *H01L 2924/19107* (2013.01)

(56) References Cited

U.S. PATENT DOCUMENTS

| | | | |
|---|---|---|---|
| 6,365,980 B1* | 4/2002 | Carter et al. | 257/787 |
| 6,501,184 B1* | 12/2002 | Shin | H01L 21/56 257/778 |
| 6,531,328 B1* | 3/2003 | Chen | H01L 24/97 438/106 |
| 6,888,222 B2* | 5/2005 | Shizuno | H01L 23/3128 257/618 |
| 7,005,737 B2* | 2/2006 | Zhao et al. | 257/707 |
| 7,208,345 B2* | 4/2007 | Meyer | H01L 24/24 257/E21.502 |
| 7,208,825 B2* | 4/2007 | Pu et al. | 257/686 |
| 7,473,629 B2* | 1/2009 | Tai et al. | 438/613 |
| 7,642,128 B1* | 1/2010 | Lin et al. | 438/106 |
| 7,714,341 B2* | 5/2010 | Chil Keun | H01L 33/486 257/98 |
| 7,811,863 B1* | 10/2010 | Lin | H01L 21/565 257/E21.502 |
| 7,838,410 B2* | 11/2010 | Hirao | H01L 21/6835 257/E21.006 |
| 7,944,043 B1* | 5/2011 | Chung et al. | 257/698 |
| 7,952,176 B2 | 5/2011 | Pagaila et al. | |
| 8,084,867 B2* | 12/2011 | Tang | H01L 24/24 257/686 |
| 8,198,136 B2* | 6/2012 | Oh | H01L 24/24 438/107 |
| 8,648,365 B2* | 2/2014 | Won | H01L 25/167 257/98 |
| 2004/0110323 A1* | 6/2004 | Becker | H01L 21/56 438/127 |
| 2006/0124953 A1* | 6/2006 | Negley | H01L 33/486 257/99 |
| 2006/0258044 A1* | 11/2006 | Meyer et al. | 438/106 |
| 2007/0120272 A1* | 5/2007 | Nakagawa | H01L 23/24 257/787 |
| 2008/0032456 A1* | 2/2008 | Ahn et al. | 438/124 |
| 2008/0137312 A1* | 6/2008 | Lee | H01L 23/3135 361/735 |
| 2008/0258289 A1* | 10/2008 | Pendse | H01L 21/56 257/690 |
| 2009/0085185 A1* | 4/2009 | Byun | H01L 25/50 257/686 |
| 2009/0085186 A1* | 4/2009 | Meyer | H01L 21/561 257/690 |
| 2009/0224402 A1* | 9/2009 | Do et al. | 257/738 |
| 2010/0123251 A1 | 5/2010 | Chow et al. | |
| 2010/0140811 A1* | 6/2010 | Leal | H01L 24/24 257/777 |
| 2010/0140813 A1 | 6/2010 | Pagaila et al. | |
| 2010/0142174 A1* | 6/2010 | Pagaila | H01L 23/3128 361/820 |
| 2011/0233754 A1* | 9/2011 | Meyer-Berg | 257/693 |
| 2011/0241192 A1* | 10/2011 | Ding et al. | 257/686 |
| 2011/0241193 A1* | 10/2011 | Ding et al. | 257/686 |
| 2012/0139095 A1* | 6/2012 | Manusharow | H01L 23/36 257/690 |
| 2012/0139116 A1* | 6/2012 | Manusharow | H01L 21/4857 257/762 |
| 2013/0049208 A1 | 2/2013 | Cho et al. | |

\* cited by examiner

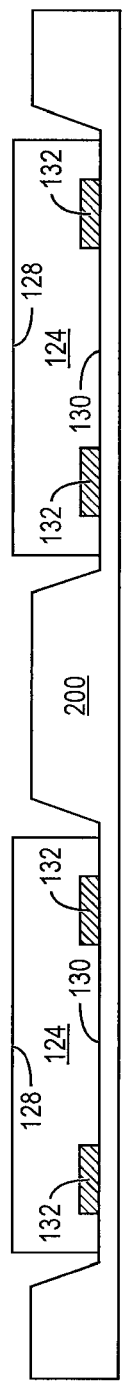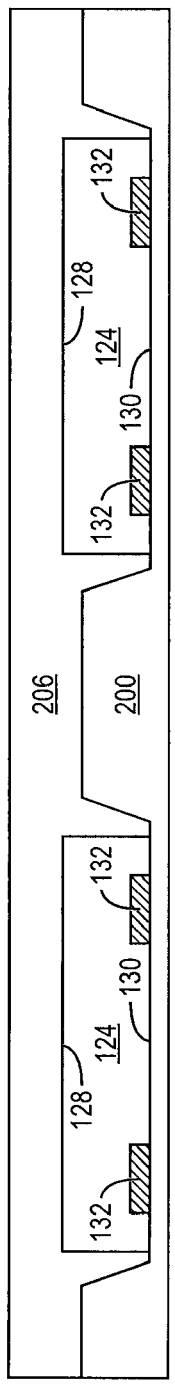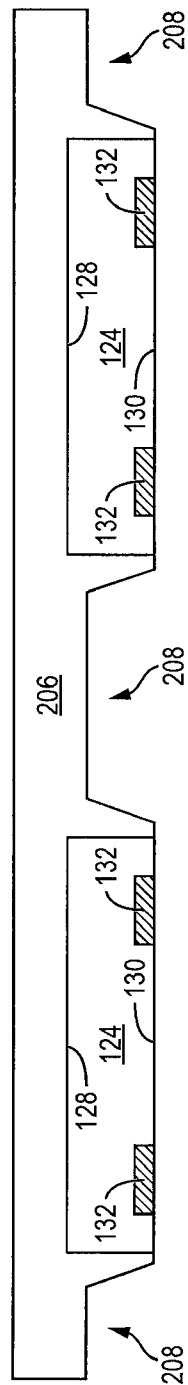

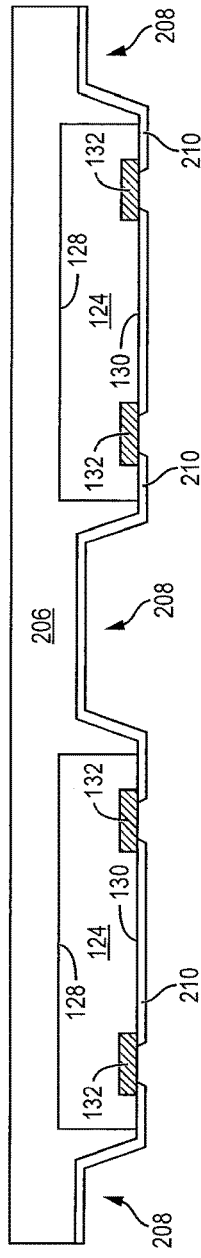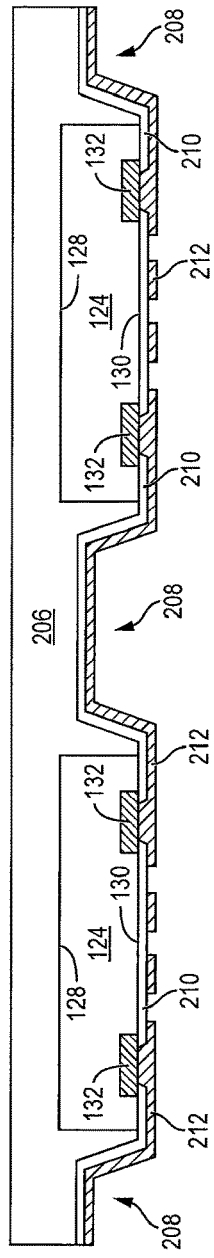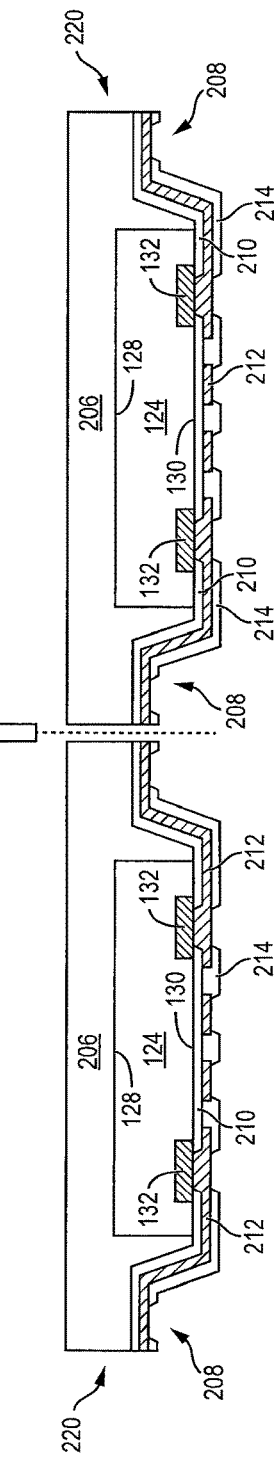

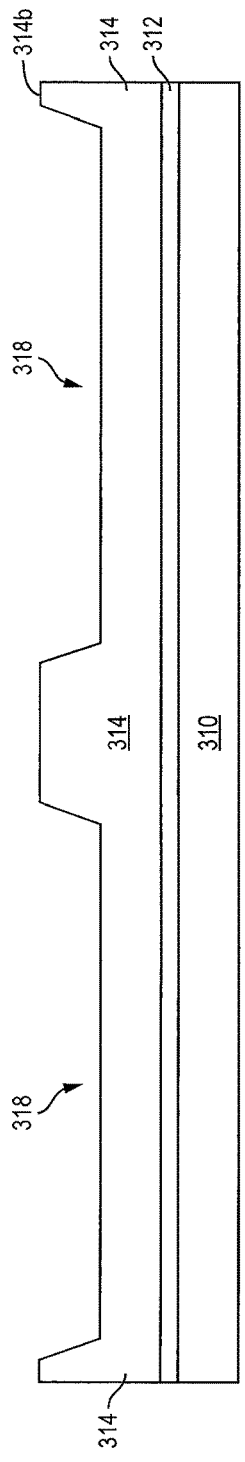
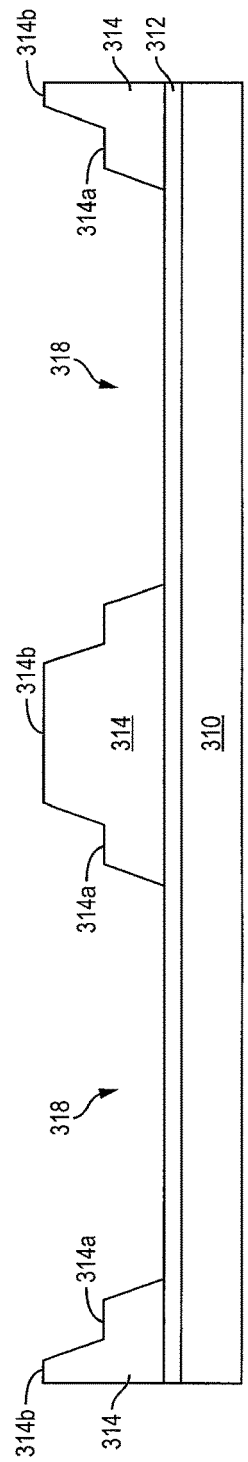
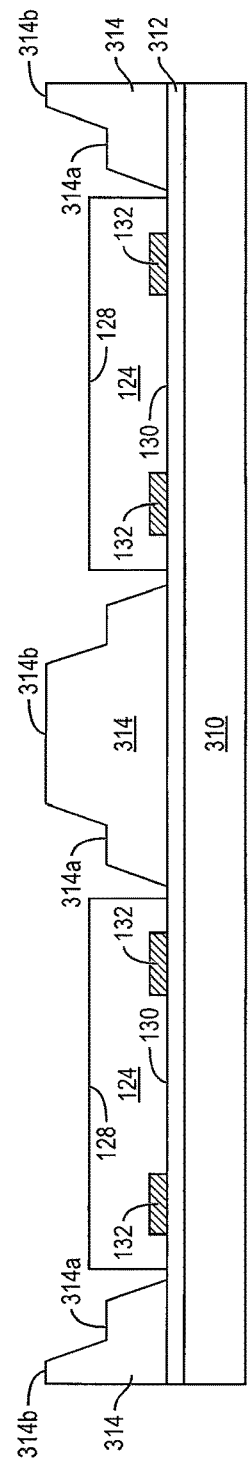

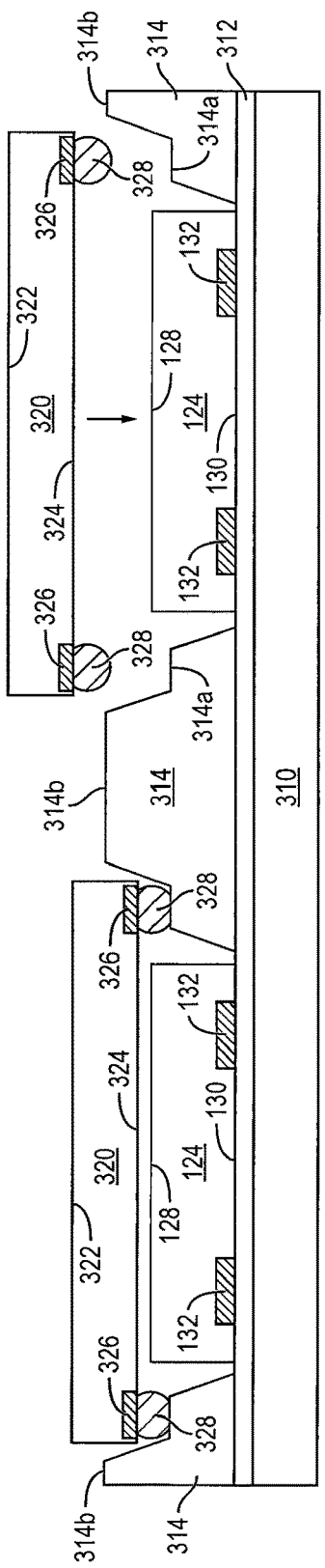
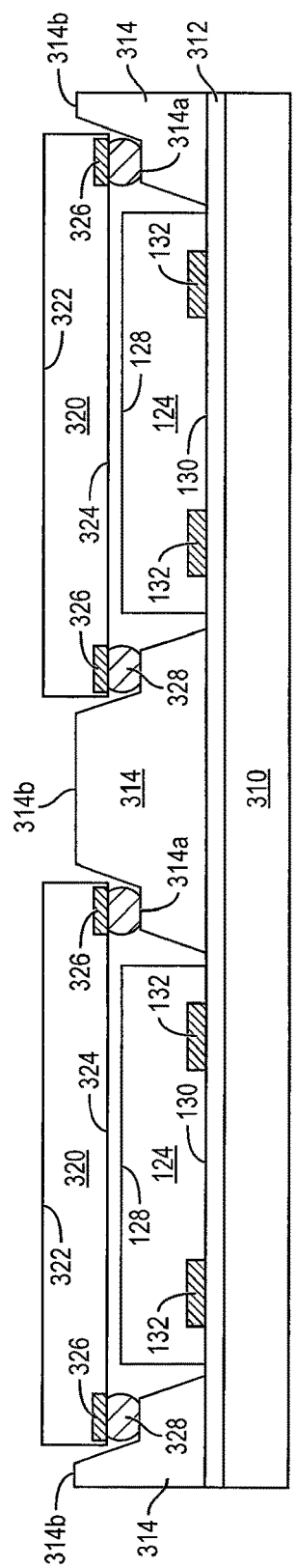
FIG. 17f
FIG. 17g

SEMICONDUCTOR DEVICE AND METHOD OF FORMING FO-WLCSP WITH RECESSED INTERCONNECT AREA IN PERIPHERAL REGION OF SEMICONDUCTOR DIE

FIELD OF THE INVENTION

The present invention relates in general to semiconductor devices and, more particularly, to a semiconductor device and method of forming a Fo-WLCSP with recessed interconnect areas in a peripheral region of the semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional fan-out wafer level chip scale package (Fo-WLCSP) may contain a semiconductor die with bumps formed over contact pads on an active surface of the die. The bumped semiconductor die is mounted to conductive traces formed on a substrate. The semiconductor die and substrate are covered with an encapsulant. Bumps are formed on a surface of the substrate opposite the semiconductor die. The substrate provides expanded interconnect capability outside the footprint of the semiconductor die.

Many applications require a thin semiconductor die to reduce the Fo-WLCSP profile. The thin semiconductor die is susceptible to damage during interconnect, e.g., wire bonding, and other handling. In cases where the thin semiconductor die is integrated into a fan-in semiconductor package-on-package (Fi-PoP), the thin die requires a specialized or dedicated mold chase for encapsulation. The mold chase for the thin semiconductor die adds manufacturing cost and reduces units per hour (UPH) production scheduling.

SUMMARY OF THE INVENTION

A need exists for a low profile Fo-WLCSP robust against defects from interconnect processes and other handling. Accordingly, in one embodiment, the present invention is a method of making a semiconductor device comprising the steps of providing a carrier, forming a temporary layer over the carrier, forming a plurality of recesses in the temporary layer, disposing a first semiconductor die within the recesses of the temporary layer, and depositing an encapsulant over the first semiconductor die and temporary layer. The encapsulant extends into the recesses in the temporary layer. The method further includes the steps of removing the carrier and temporary layer to form recessed interconnect areas around the first semiconductor die, and forming a conductive layer over the first semiconductor die and encapsulant and into the recessed interconnect areas.

In another embodiment, the present invention is a method of making a semiconductor device comprising the steps of providing a carrier, forming a plurality of recesses in the carrier, disposing a first semiconductor die within the recesses of the carrier, depositing a first encapsulant over the first semiconductor die and carrier, removing the carrier to form recessed interconnect areas around the first semiconductor die, and forming a conductive layer over the first semiconductor die and first encapsulant and into the recessed interconnect areas.

In another embodiment, the present invention is a method of making a semiconductor device comprising the steps of providing a carrier, disposing a first semiconductor die to the carrier, depositing a first encapsulant over the first semiconductor die and carrier, removing a portion of the first encapsulant to form recessed interconnect areas around the first semiconductor die, and forming a conductive layer over the first semiconductor die and first encapsulant and into the recessed interconnect areas.

In another embodiment, the present invention is a semiconductor device comprising a first semiconductor die and first encapsulant deposited over the first semiconductor die. The first encapsulant includes a plurality of recessed interconnect areas around the first semiconductor die. A conductive layer is formed over the first semiconductor die and first encapsulant and into the recessed interconnect areas.

BRIEF DESCRIPTION OF THE DRAWINGS

FIGS. 8a-8i illustrate a process of forming a Fo-WLCSP with recessed interconnect areas in a peripheral region of the semiconductor die by removing a portion of a carrier;

FIGS. 17a-17j illustrate a process of forming a Fo-WLCSP with multi-step recessed interconnect areas in a peripheral region of stacked semiconductor die;

DETAILED DESCRIPTION OF THE DRAWINGS

Figure 1:
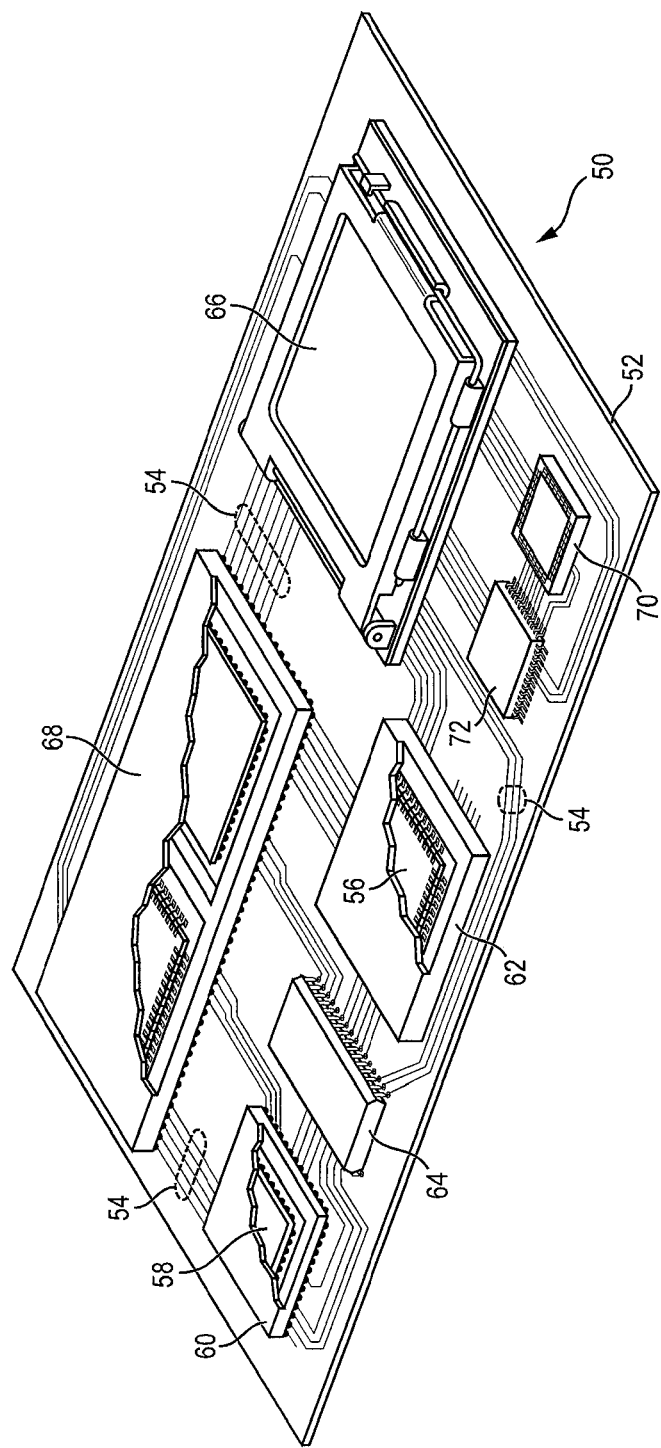
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
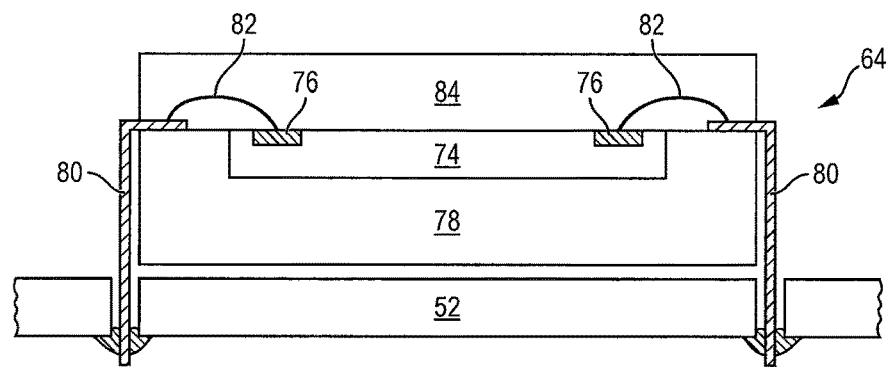
FIGS. 2a-2c illustrate further detail of the representative semiconductor packages mounted to the PCB.
Figure 2B:
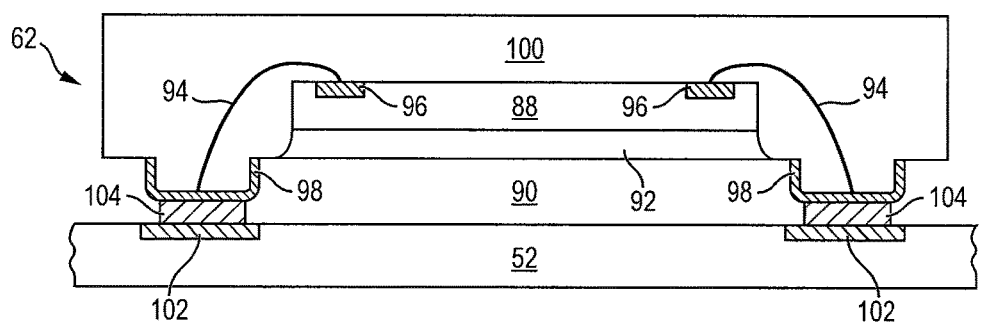
Figure 2C:
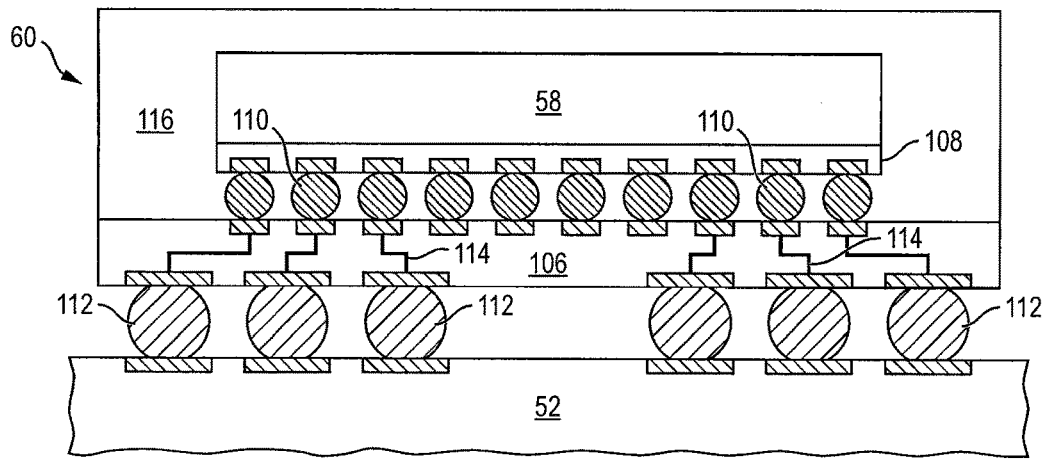

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
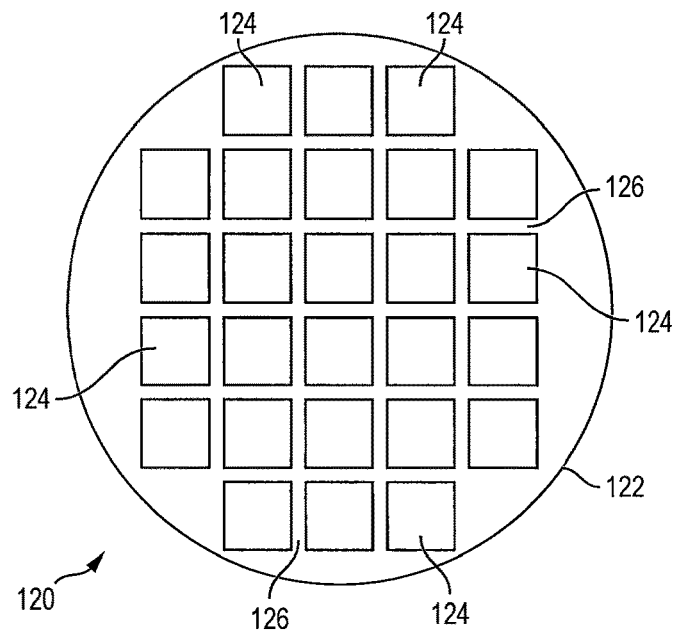
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124.

Figure 3B:
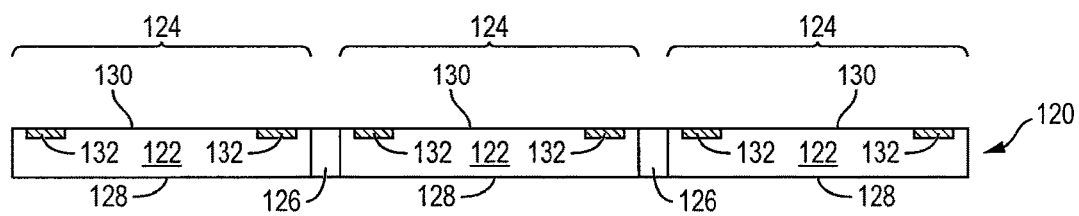

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. Semiconductor die 124 can be a flipchip type die, conductive through silicon vias (TSV) die, or bond wire die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
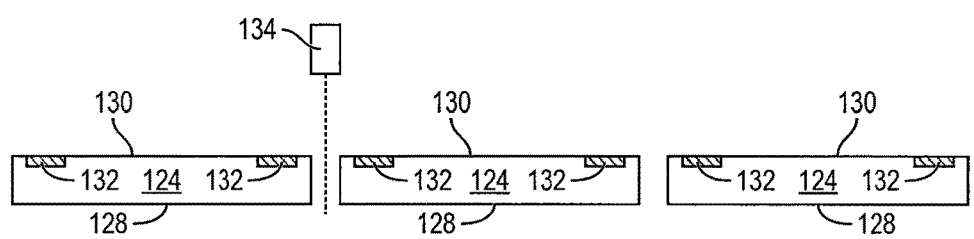

In FIG. 3c, semiconductor wafer 120 is singulated through saw street 126 using a saw blade or laser cutting tool 134 into individual semiconductor die 124.

Figure 4A:
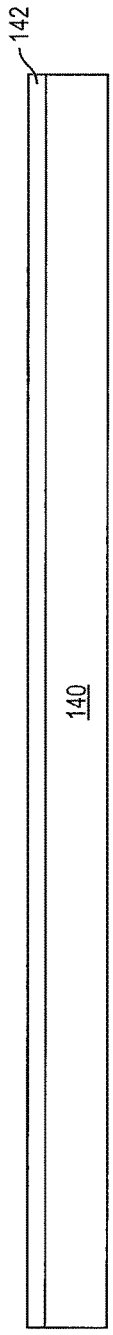
FIGS. 4a-4j illustrate a process of forming a Fo-WLCSP with recessed interconnect areas in a peripheral region of the semiconductor die by removing a portion of a dam material.

FIGS. 4a-4j illustrate, in relation to FIGS. 1 and 2a-2c, a process of forming a Fo-WLCSP with recessed interconnect areas in a peripheral region of the semiconductor die by removing a portion of a dam material. FIG. 4a shows temporary carrier 140 containing a sacrificial base material such as silicon, germanium, gallium arsenide, indium phosphide, silicon carbide, resin, or other suitable low-cost, rigid material for structural support. An interface layer or double-sided adhesive tape 142 is formed over carrier 140 as a temporary adhesive bonding film or etch-stop layer.

Figure 4B:
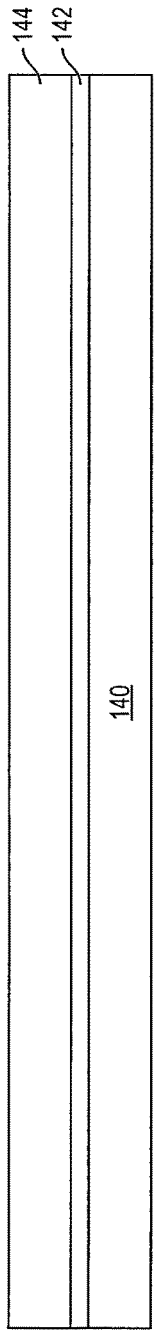
Figure 4C:
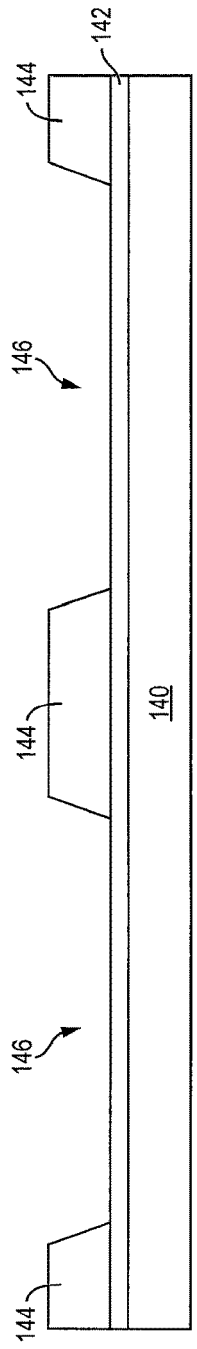

In FIG. 4b, a dam material 144 is formed over interface layer 142 and carrier 140. Dam material 144 can be solder resist, adhesive, insulation, polymer, metal, or other suitable barrier material. Dam material 144 is formed by screen printing, electrolytic plating, electroless plating, spray coating, or other suitable deposition process depending on the material. In one embodiment, dam material 144 is a temporary layer with a thickness ranging from 0.30 to 0.475 millimeters (mm). A portion of dam material 144 is removed by an etching process to form recesses or cavities 146 in the dam material which extend down to interface layer 142, as shown in FIG. 4c.

Figure 4D:
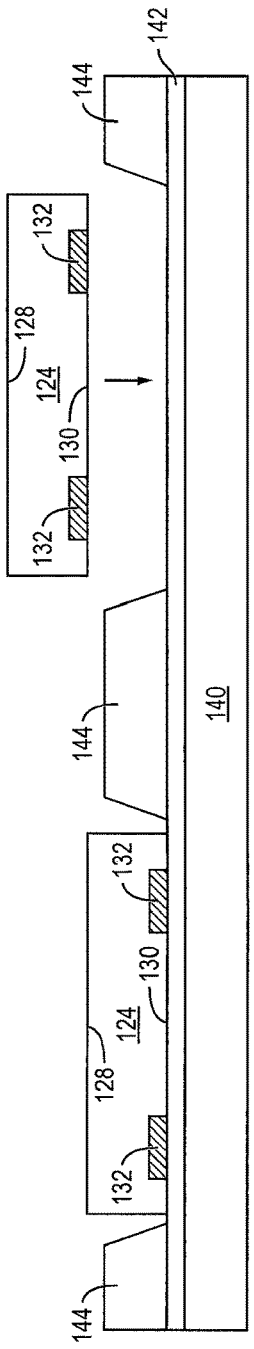
Figure 4E:
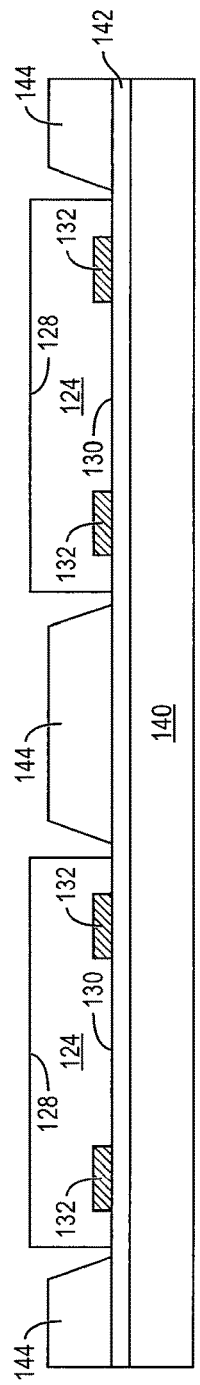

In FIG. 4d, semiconductor die 124 from FIGS. 3a-3c are positioned over and mounted partially within recesses 146 using a pick and place operation with active surface 130 oriented toward carrier 140. FIG. 4e shows semiconductor die 124 mounted to interface layer 142 and partially disposed within recesses 146. The back surface 128 of semiconductor die 124 extends above the top surface of dam material 144.

Figure 4F:
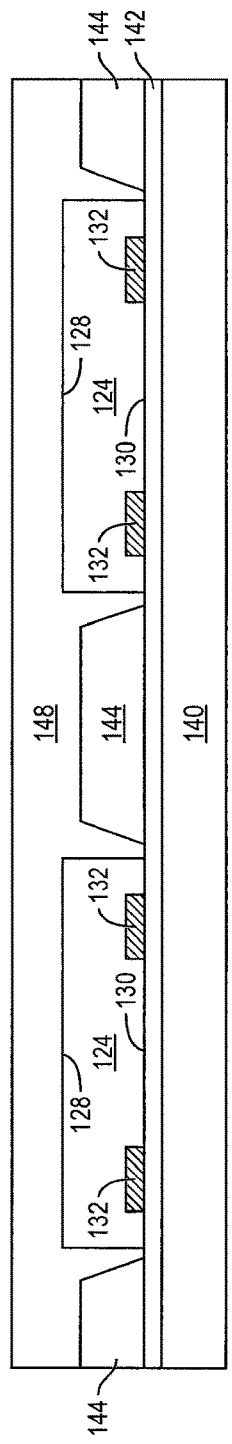

In FIG. 4f, an encapsulant or molding compound 148 is deposited over semiconductor die 124, dam material 144, and carrier 140 using a paste printing, compressive molding, transfer molding, liquid encapsulant molding, vacuum lamination, spin coating, or other suitable applicator. Encapsulant 148 can be polymer composite material, such as epoxy resin with filler, epoxy acrylate with filler, or polymer with proper filler. The width of recess 146 is greater than a width of semiconductor die 124 so encapsulant 148 extends down to a level of active surface 130. Encapsulant 148 is non-conductive and environmentally protects the semiconductor device from external elements and contaminants. In another embodiment, a film assist mold (FAM) can be applied over semiconductor die 124 and dam material 144.

Figure 4G:
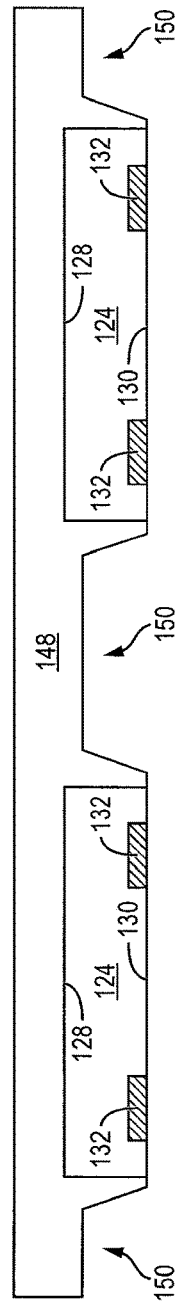

In FIG. 4g, carrier 140, interface layer 142, and dam material 144 are removed by chemical etching, mechanical peeling, CMP, mechanical grinding, thermal bake, UV light, laser scanning, or wet stripping to expose active surface 130, conductive layer 132, and encapsulant 148. The removal of dam material 148 leaves recesses or cavities 150 in encapsulant 148 around a fan-out peripheral region of semiconductor die 124.

Figure 4H:
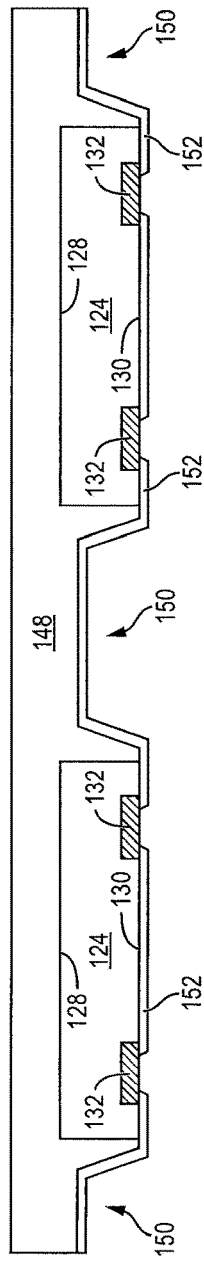

In FIG. 4h, an insulating or passivation layer 152 is conformally applied over encapsulant 148, the exposed active surface 130, and the exposed conductive layer 132 using PVD, CVD, printing, spin coating, spray coating, lamination, sintering or thermal oxidation. The insulating layer 152 contains one or more layers of silicon dioxide (SiO2), silicon nitride (Si3N4), silicon oxynitride (SiON), tantalum pentoxide (Ta2O5), aluminum oxide (Al2O3), or other suitable material having similar insulating and structural properties. The insulating layer 152 follows the contour of encapsulant 148, including into recesses 150. A portion of insulating layer 152 is removed by an etching process through a patterned photoresist layer to expose conductive layer 132.

Figure 4I:
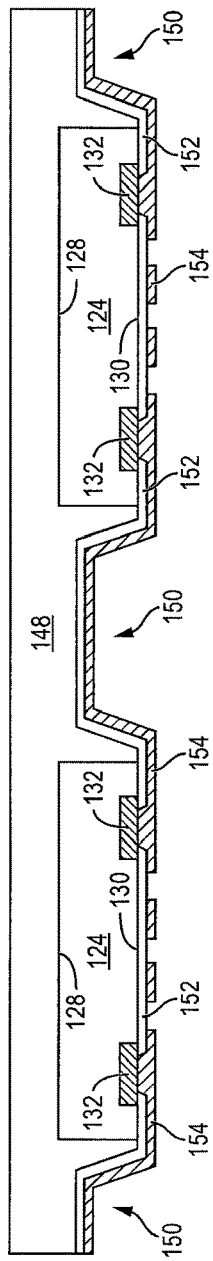

In FIG. 4i, an electrically conductive layer 154 is conformally applied over conductive layer 132 and insulating layer 152 using a patterning and metal deposition process such as printing, PVD, CVD, sputtering, electrolytic plating, and electroless plating. Conductive layer 154 can be one or more layers of Al, Cu, Sn, Ti, Ni, Au, Ag, or other suitable electrically conductive material. Conductive layer 154 follows the contour of encapsulant 148, including into recesses 150. In one embodiment, conductive layer 154 includes an adhesion layer, barrier layer, and seed or wetting layer. One portion of conductive layer 154 is electrically connected to conductive layer 132. Other portions of conductive layer 154 can be electrically common or electrically isolated depending on the design and function of semiconductor die 124.

Figure 4J:
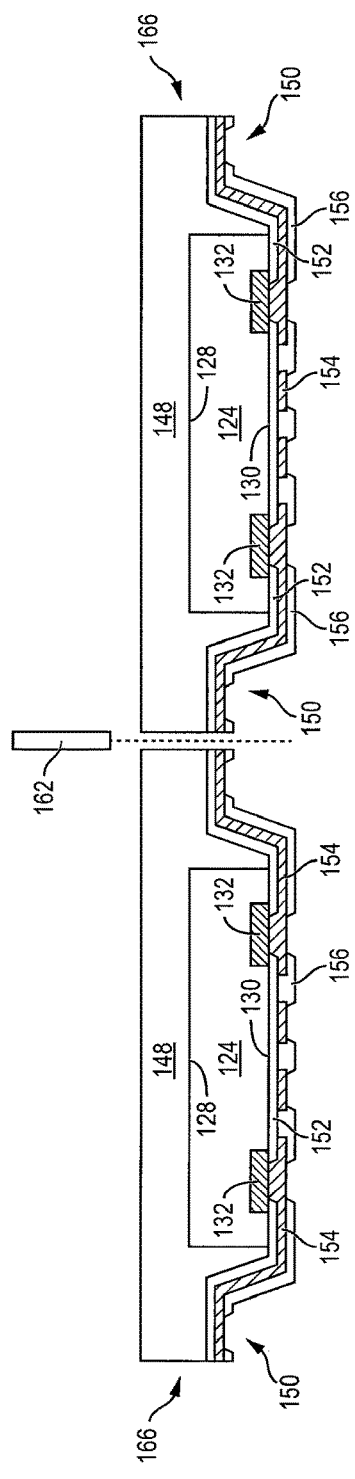

In FIG. 4j, an insulating or passivation layer 156 is conformally applied over insulating layer 152 and conductive layer 154 using PVD, CVD, printing, spin coating, spray coating, lamination, sintering or thermal oxidation. The insulating layer 156 contains one or more layers of SiO2, Si3N4, SiON, Ta2O5, Al2O3, or other suitable material having similar insulating and structural properties. The insulating layer 156 follows the contour of encapsulant 148, including into recesses 150. A portion of insulating layer 156 is removed by an etching process through a patterned photoresist layer to expose portions of conductive layer 154.

The assembly in FIG. 4j is singulated through encapsulant 148, conductive layer 154, and insulating layers 152 and 156 with saw blade or laser cutting tool 162 into individual Fo-WLSCP 166.

Figure 5A:
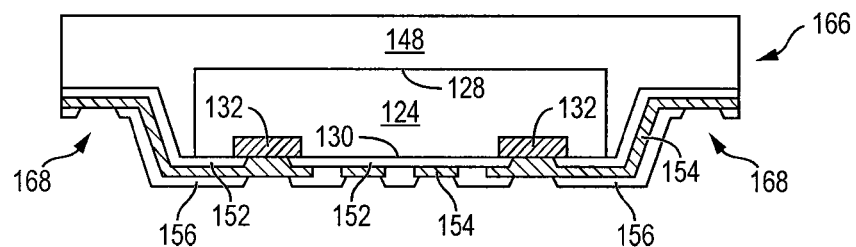
FIGS. 5a-5b illustrate the Fo-WLCSP with recessed interconnect areas in a peripheral region of the semiconductor die according to FIGS. 4a-4j.
Figure 5B:
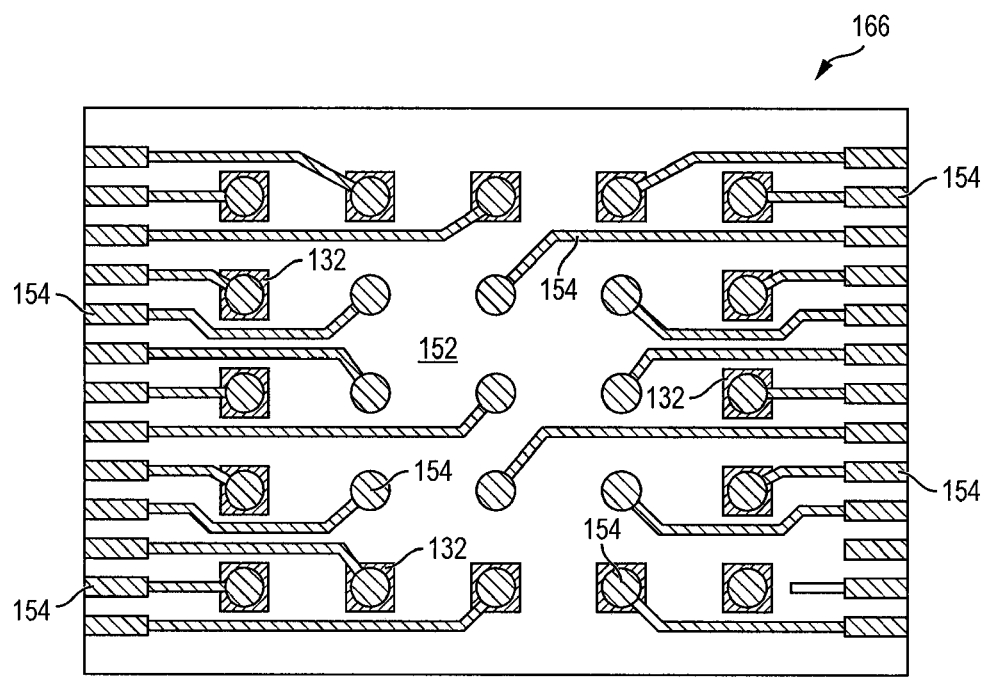

FIG. 5a shows Fo-WLCSP 166 after singulation. Semiconductor die 124 is electrically connected to conductive layer 154. The recesses 150 in encapsulant 148 formed by removing dam material 144 provide recessed interconnect areas 168 around the fan-out peripheral region of semiconductor die 124. Conductive layer 154 in recessed interconnect areas 168 allow for bonding to bumps or bond wires as electrical interconnect to other semiconductor devices or substrate. Conductive layer 154 in recessed interconnect areas 168 redistributes the electrical interconnect for semiconductor die 124 while reducing the profile of Fo-WLCSP 166. Fo-WLCSP 166 remains robust during interconnect and other handling. Fo-WLCSP 166 is formed at the wafer level which reduces cost and increases manufacture through-put in terms of the UPH production schedule. FIG. 5b shows a plan view of Fo-WLCSP 166 with conductive layer 154 formed over insulating layer 152.

Figure 6A:
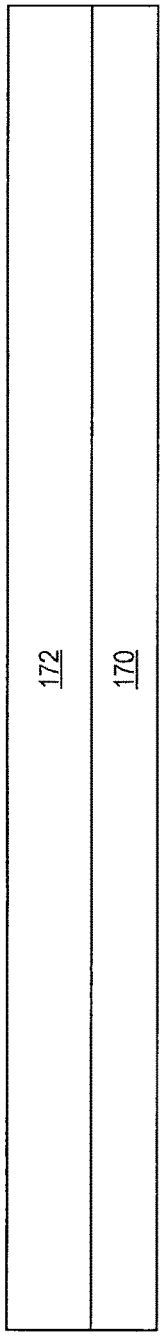
FIGS. 6a-6i illustrate a process of forming a Fo-WLCSP with recessed interconnect areas in a peripheral region of the semiconductor die by removing a portion of an adhesive layer.
Figure 6B:
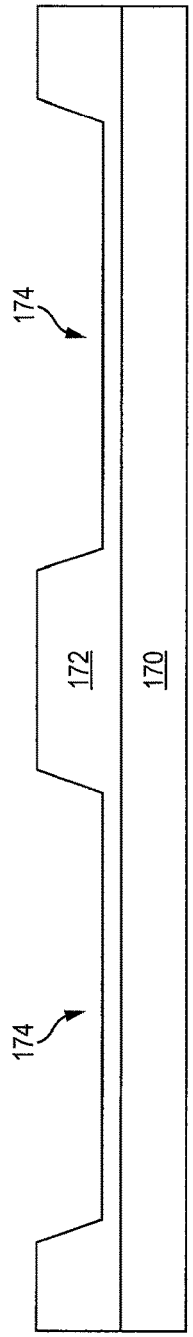

FIGS. 6a-6i illustrate, in relation to FIGS. 1 and 2a-2c, a process of forming a Fo-WLCSP with recessed interconnect areas in a peripheral region of the semiconductor die by removing a portion of a thick adhesive layer. FIG. 6a shows temporary carrier 170 containing a sacrificial base material such as silicon, germanium, gallium arsenide, indium phosphide, silicon carbide, resin, or other suitable low-cost, rigid material for structural support. A thick adhesive tape or layer 172 is formed over carrier 170. In one embodiment, adhesive layer 172 is a temporary layer with a thickness ranging from 0.30 to 0.475 mm. A portion of adhesive layer 172 is removed by an etching process to form recesses or cavities 174 which extend partially into the adhesive layer, as shown in FIG. 6b. In one embodiment, recesses 174 extend through 60-70% of thickness of adhesive layer 172.

Figure 6C:
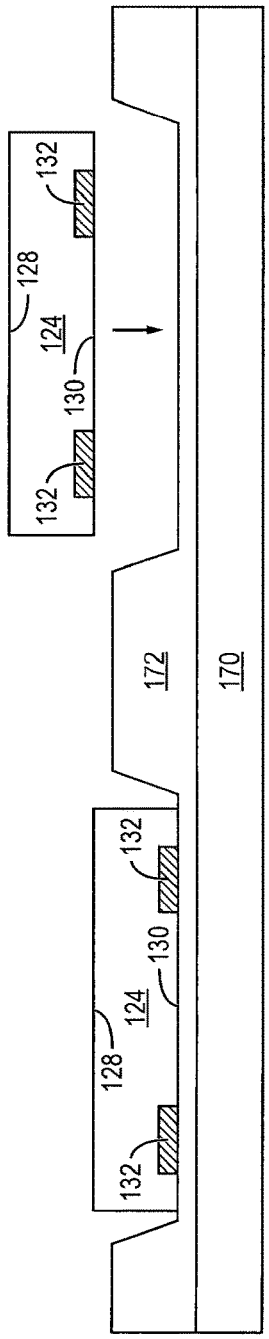
Figure 6D:
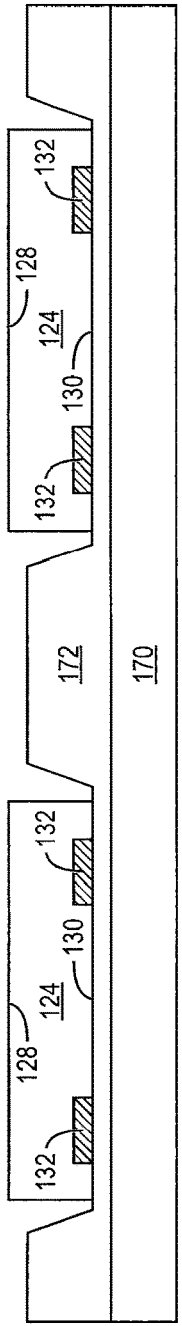

In FIG. 6c, semiconductor die 124 from FIGS. 3a-3c are positioned over and mounted partially within recesses 174 using a pick and place operation with active surface 130 oriented toward carrier 170. FIG. 6d shows semiconductor die 124 mounted to adhesive layer 172 and partially disposed within recesses 174. The back surface 128 of semiconductor die 124 extends above the top surface of adhesive layer 172.

Figure 6E:
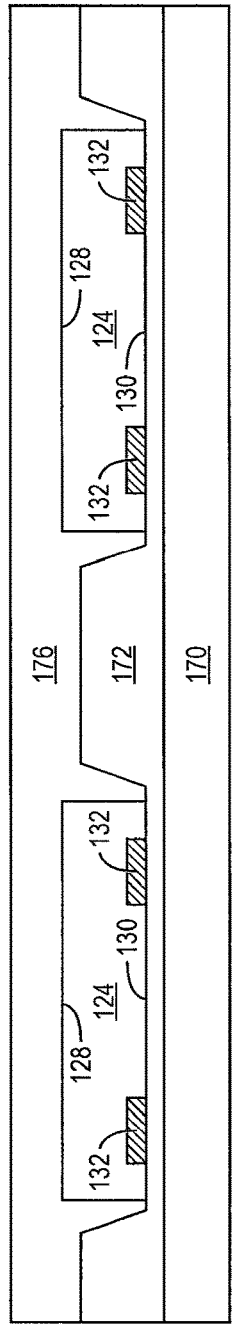

In FIG. 6e, an encapsulant or molding compound 176 is deposited over semiconductor die 124, adhesive layer 172, and carrier 170 using a paste printing, compressive molding, transfer molding, liquid encapsulant molding, vacuum lamination, spin coating, or other suitable applicator. Encapsulant 176 can be polymer composite material, such as epoxy resin with filler, epoxy acrylate with filler, or polymer with proper filler. The width of recess 174 is greater than a width of semiconductor die 124 so encapsulant 176 extends down to a level of active surface 130. Encapsulant 176 is non-conductive and environmentally protects the semiconductor device from external elements and contaminants. In another embodiment, a FAM can be applied over semiconductor die 124 and adhesive layer 172.

Figure 6F:
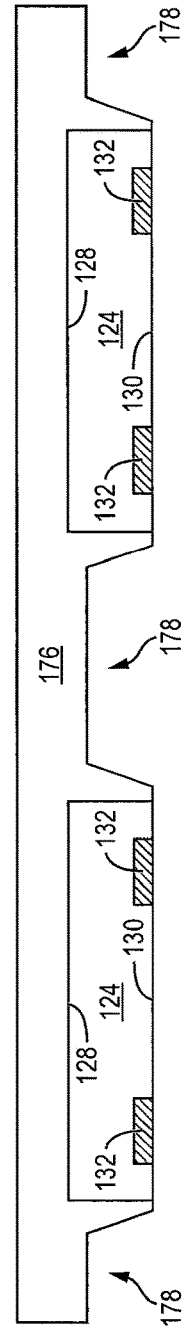

In FIG. 6f, carrier 170 and adhesive layer 172 are removed by chemical etching, mechanical peeling, CMP, mechanical grinding, thermal bake, UV light, laser scanning, or wet stripping to expose active surface 130, conductive layer 132, and encapsulant 176. The removal of adhesive layer 172 leaves recesses or cavities 178 in encapsulant 176 around a fan-out peripheral region of semiconductor die 124.

Figure 6G:
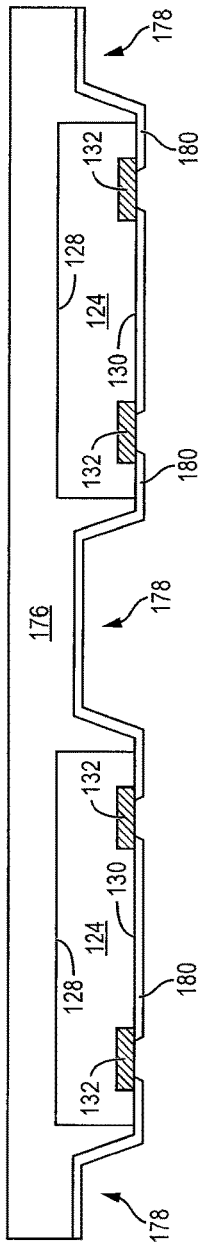

In FIG. 6g, an insulating or passivation layer 180 is conformally applied over encapsulant 176, the exposed active surface 130, and the exposed conductive layer 132 using PVD, CVD, printing, spin coating, spray coating, lamination, sintering or thermal oxidation. The insulating layer 180 contains one or more layers of SiO2, Si3N4, SiON, Ta2O5, Al2O3, or other suitable material having similar insulating and structural properties. The insulating layer 180 follows the contour of encapsulant 176, including into recesses 178. A portion of insulating layer 180 is removed by an etching process through a patterned photoresist layer to expose conductive layer 132.

Figure 6H:
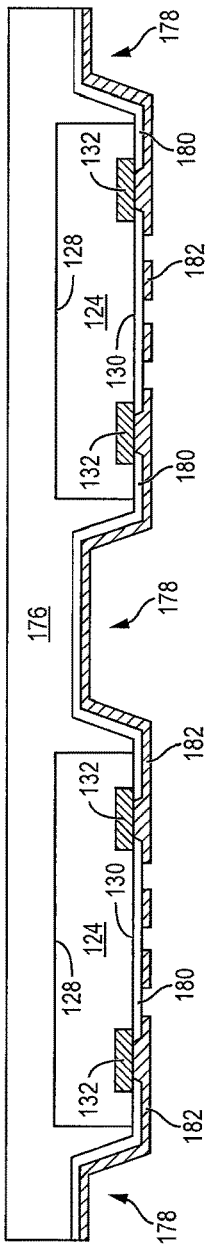

In FIG. 6h, an electrically conductive layer 182 is conformally applied over conductive layer 132 and insulating layer 180 using a patterning and metal deposition process such as printing, PVD, CVD, sputtering, electrolytic plating, and electroless plating. Conductive layer 182 can be one or more layers of Al, Cu, Sn, Ti, Ni, Au, Ag, or other suitable electrically conductive material. Conductive layer 182 follows the contour of encapsulant 176, including into recesses 178. In one embodiment, conductive layer 182 includes an adhesion layer, barrier layer, and seed or wetting layer. One portion of conductive layer 182 is electrically connected to conductive layer 132. Other portions of conductive layer 182 can be electrically common or electrically isolated depending on the design and function of semiconductor die 124.

Figure 6I:
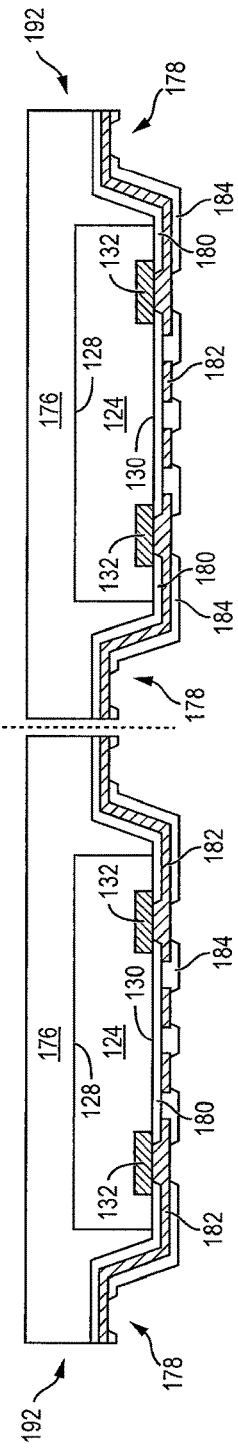

In FIG. 6i, an insulating or passivation layer 184 is conformally applied over insulating layer 180 and conductive layer 182 using PVD, CVD, printing, spin coating, spray coating, lamination, sintering or thermal oxidation. The insulating layer 184 contains one or more layers of SiO2, Si3N4, SiON, Ta2O5, Al2O3, or other suitable material having similar insulating and structural properties. The insulating layer 184 follows the contour of encapsulant 176, including into recesses 178. A portion of insulating layer 184 is removed by an etching process through a patterned photoresist layer to expose portions of conductive layer 182.

The assembly in FIG. 6i is singulated through encapsulant 176, conductive layer 182, and insulating layers 180 and 184 with saw blade or laser cutting tool 188 into individual Fo-WLSCP 192.

Figure 7A:
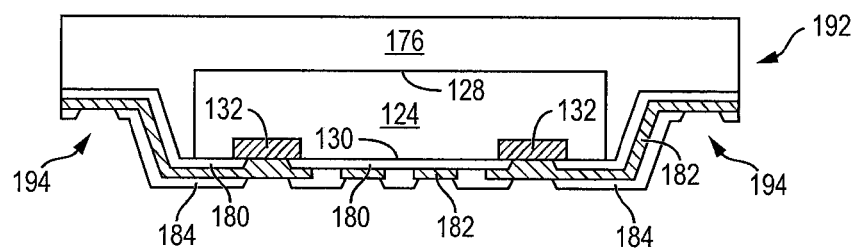
FIGS. 7a-7b illustrate the Fo-WLCSP with recessed interconnect areas in a peripheral region of the semiconductor die according to FIGS. 6a-6i.
Figure 7B:
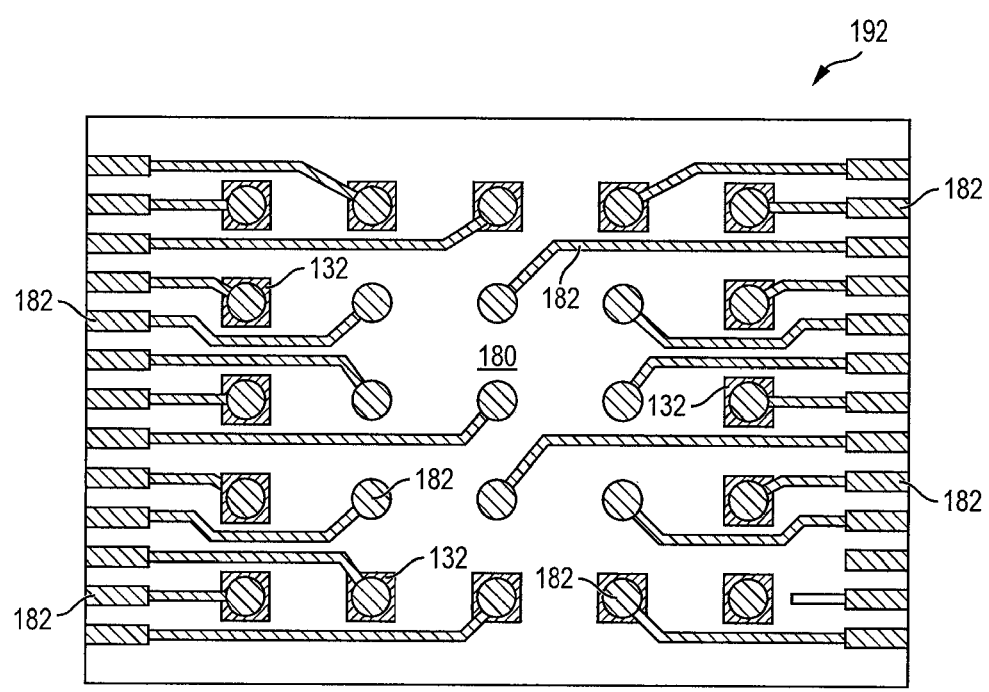

FIG. 7a shows Fo-WLCSP 192 after singulation. Semiconductor die 124 is electrically connected to conductive layer 182. The recesses 178 in encapsulant 176 formed by removing adhesive layer 172 provide recessed interconnect areas 194 around the fan-out peripheral region of semiconductor die 124. Conductive layer 182 in recessed interconnect areas 194 allow for bonding to bumps or bond wires as electrical interconnect to other semiconductor devices or substrate. Conductive layer 182 in recessed interconnect areas 194 redistributes the electrical interconnect for semiconductor die 124 while reducing the profile of Fo-WLCSP 192. Fo-WLCSP 192 remains robust during interconnect and other handling. Fo-WLCSP 192 is formed at the wafer level which reduces cost and increases manufacture through-put in terms of the UPH production schedule. FIG. 7b shows a plan view of Fo-WLCSP 192 with conductive layer 182 formed over insulating layer 180.

Figure 8A:
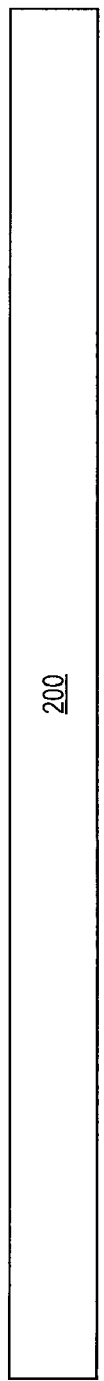
Figure 8B:
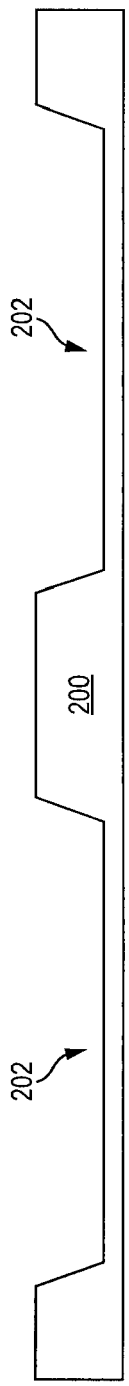

FIGS. 8a-8i illustrate, in relation to FIGS. 1 and 2a-2c, a process of forming a Fo-WLCSP with recessed interconnect areas in a peripheral region of the semiconductor die by removing a portion of a carrier. FIG. 8a shows temporary carrier 200 containing a sacrificial base material such as silicon, germanium, gallium arsenide, indium phosphide, silicon carbide, resin, or other suitable low-cost, rigid material for structural support. A portion of carrier 200 is removed by a wet etching process to form recesses or cavities 202 which extend partially into the carrier, as shown in FIG. 8b. In one embodiment, carrier 200 has a thickness ranging from 0.30 to 0.475 mm and recesses 202 extend through 60-70% of the thickness of the carrier.

Figure 8C:
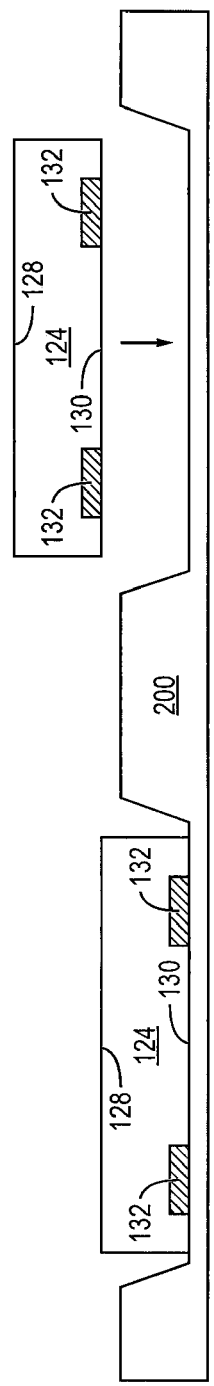

In FIG. 8c, semiconductor die 124 from FIGS. 3a-3c are positioned over and mounted partially within recesses 202 using a pick and place operation with active surface 130 oriented toward carrier 200. FIG. 8d shows semiconductor die 124 mounted to carrier 200 and partially disposed within recesses 202. The back surface 128 of semiconductor die 124 extends above the top surface of carrier 200.

In FIG. 8e, an encapsulant or molding compound 206 is deposited over semiconductor die 124 and carrier 200 using a paste printing, compressive molding, transfer molding, liquid encapsulant molding, vacuum lamination, spin coating, or other suitable applicator. Encapsulant 206 can be polymer composite material, such as epoxy resin with filler, epoxy acrylate with filler, or polymer with proper filler. The width of recess 202 is greater than a width of semiconductor die 124 so encapsulant 206 extends down to a level of active surface 130. Encapsulant 206 is non-conductive and environmentally protects the semiconductor device from external elements and contaminants. In another embodiment, a FAM can be applied over semiconductor die 124 and carrier 200.

In FIG. 8f, carrier 200 is removed by chemical etching, mechanical peeling, CMP, mechanical grinding, thermal bake, UV light, laser scanning, or wet stripping to expose active surface 130, conductive layer 132, and encapsulant 206. The removal of carrier 200 leaves recesses or cavities 208 in encapsulant 206 around a fan-out peripheral region of semiconductor die 124.

In FIG. 8g, an insulating or passivation layer 210 is conformally applied over encapsulant 206, the exposed active surface 130, and the exposed conductive layer 132 using PVD, CVD, printing, spin coating, spray coating, lamination, sintering or thermal oxidation. The insulating layer 210 contains one or more layers of SiO2, Si3N4, SiON, Ta2O5, Al2O3, or other suitable material having similar insulating and structural properties. The insulating layer 210 follows the contour of encapsulant 206, including into recesses 208. A portion of insulating layer 210 is removed by an etching process through a patterned photoresist layer to expose conductive layer 132.

In FIG. 8h, an electrically conductive layer 212 is conformally applied over conductive layer 132 and insulating layer 210 using a patterning and metal deposition process such as printing, PVD, CVD, sputtering, electrolytic plating, and electroless plating. Conductive layer 212 can be one or more layers of Al, Cu, Sn, Ti, Ni, Au, Ag, or other suitable electrically conductive material. Conductive layer 212 follows the contour of encapsulant 206, including into recesses 208. In one embodiment, conductive layer 212 includes an adhesion layer, barrier layer, and seed or wetting layer. One portion of conductive layer 212 is electrically connected to conductive layer 132. Other portions of conductive layer 212 can be electrically common or electrically isolated depending on the design and function of semiconductor die 124.

In FIG. 8i, an insulating or passivation layer 214 is conformally applied over insulating layer 210 and conductive layer 212 using PVD, CVD, printing, spin coating, spray coating, lamination, sintering or thermal oxidation. The insulating layer 214 contains one or more layers of SiO2, Si3N4, SiON, Ta2O5, Al2O3, or other suitable material having similar insulating and structural properties. The insulating layer 214 follows the contour of encapsulant 206, including into recesses 208. A portion of insulating layer 214 is removed by an etching process through a patterned photoresist layer to expose portions of conductive layer 212.

The assembly in FIG. 8i is singulated through encapsulant 206, conductive layer 212, and insulating layers 210 and 214 with saw blade or laser cutting tool 218 into individual Fo-WLSCP 220.

Figure 9A:
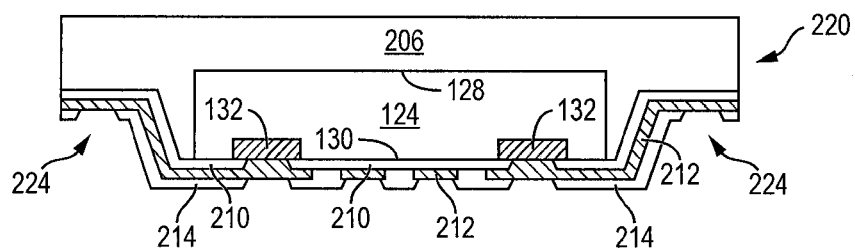
FIGS. 9a-9b illustrate the Fo-WLCSP with recessed interconnect areas in a peripheral region of the semiconductor die according to FIGS. 8a-8i.
Figure 9B:
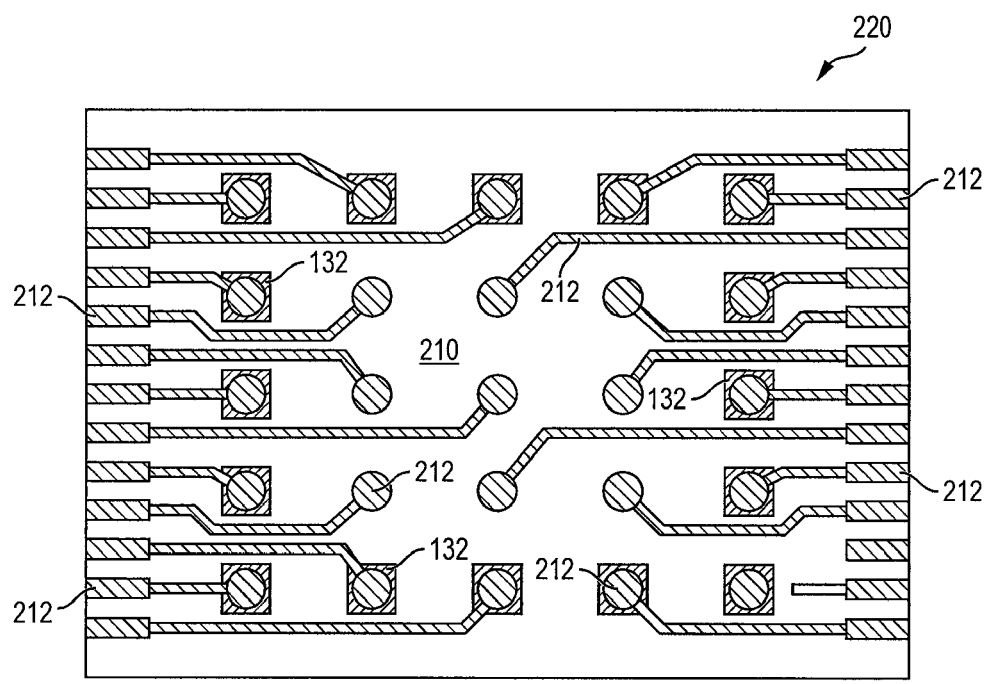

FIG. 9a shows Fo-WLCSP 220 after singulation. Semiconductor die 124 is electrically connected to conductive layer 212. The recesses 208 in encapsulant 206 formed by removing carrier 200 provide recessed interconnect areas 224 around the fan-out peripheral region of semiconductor die 124. Conductive layer 212 in recessed interconnect areas 224 allow for connecting to bumps and bond wires to provide electrical interconnect to other semiconductor devices or substrate. Conductive layer 212 in recessed interconnect areas 224 redistributes the electrical interconnect for semiconductor die 124 while reducing the profile of Fo-WLCSP 220. Fo-WLCSP 220 remains robust during interconnect and other handling. Fo-WLCSP 220 is formed at the wafer level which reduces cost and increases manufacture through-put in terms of the UPH production schedule. FIG. 9b shows a plan view of Fo-WLCSP 220 with conductive layer 212 formed over insulating layer 210.

Figure 10A:
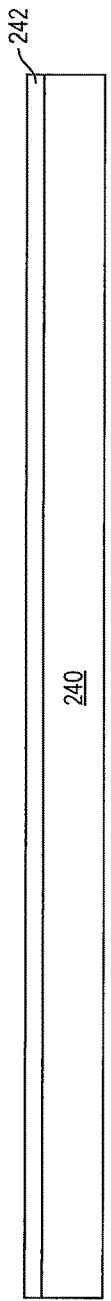
FIGS. 10a-10j illustrate a process of forming a Fo-WLCSP with recessed interconnect areas in a peripheral region of the semiconductor die by removing a portion of an encapsulant.

FIGS. 10a-10j illustrate, in relation to FIGS. 1 and 2a-2c, a process of forming a Fo-WLCSP with recessed interconnect areas in a peripheral region of the semiconductor die by removing a portion of an encapsulant. FIG. 10a shows temporary carrier 240 containing a sacrificial base material such as silicon, germanium, gallium arsenide, indium phosphide, silicon carbide, resin, or other suitable low-cost, rigid material for structural support. An interface layer or double-sided adhesive tape 242 is formed over carrier 240 as a temporary adhesive bonding film or etch-stop layer.

Figure 10B:
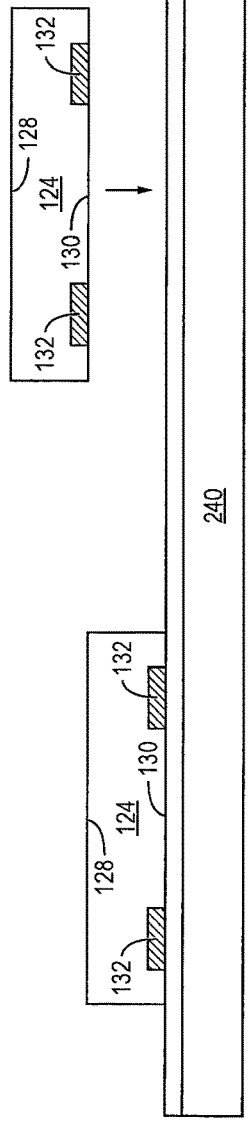
Figure 10C:
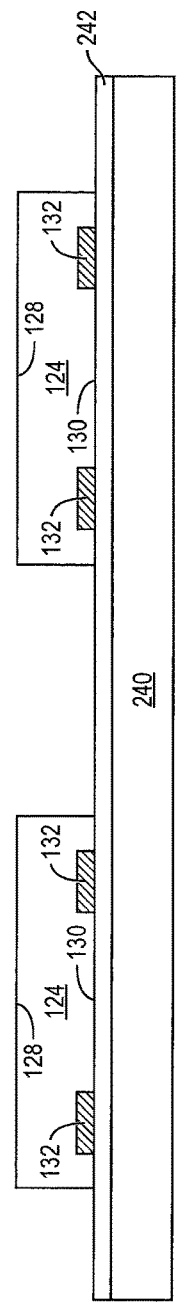

In FIG. 10b, semiconductor die 124 from FIGS. 3a-3c are positioned over and mounted to interface layer 242 and carrier 240 using a pick and place operation with active surface 130 oriented toward the carrier. FIG. 10c shows semiconductor die 124 mounted to interface layer 242 and carrier 240.

Figure 10D:
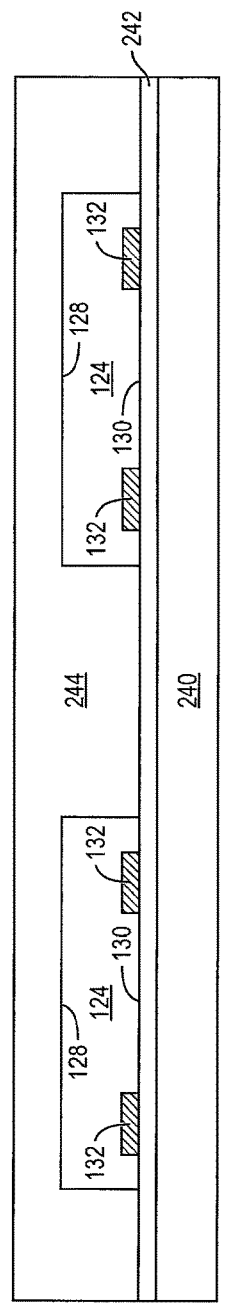

In FIG. 10d, an encapsulant or molding compound 244 is deposited over semiconductor die 124 and carrier 240 using a paste printing, compressive molding, transfer molding, liquid encapsulant molding, vacuum lamination, spin coating, or other suitable applicator. Encapsulant 244 can be polymer composite material, such as epoxy resin with filler, epoxy acrylate with filler, or polymer with proper filler. Encapsulant 244 is non-conductive and environmentally protects the semiconductor device from external elements and contaminants. In another embodiment, a FAM can be applied over semiconductor die 124 and carrier 240.

Figure 10E:
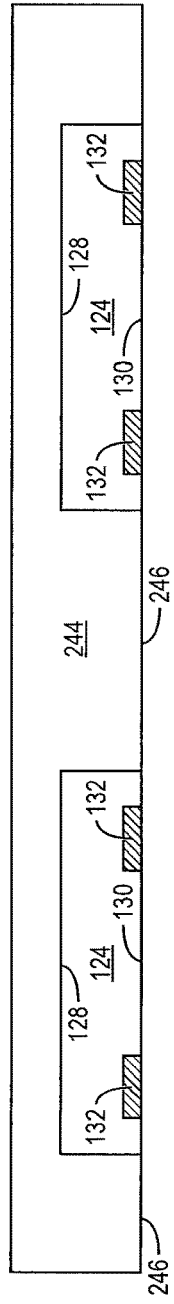

In FIG. 10e, carrier 240 and interface layer 242 are removed by chemical etching, mechanical peeling, CMP, mechanical grinding, thermal bake, UV light, laser scanning, or wet stripping to expose active surface 130, conductive layer 132, and encapsulant 244.

Figure 10F:
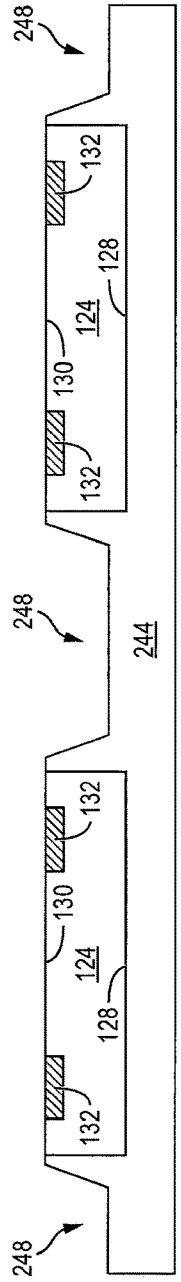
Figure 10G:
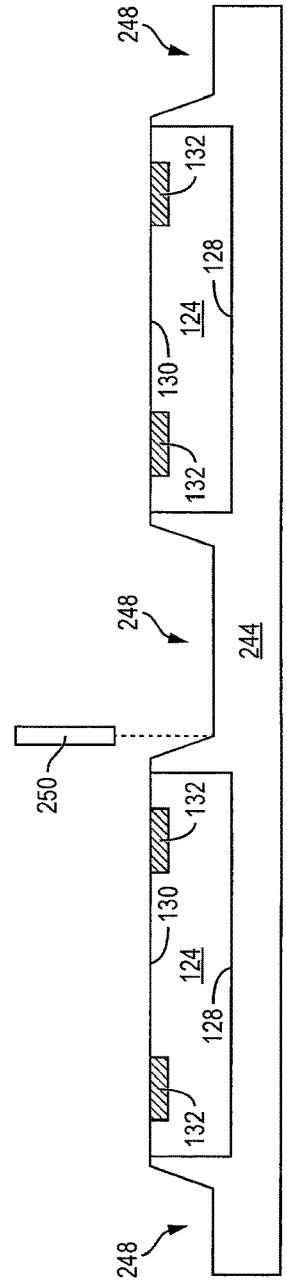

In FIG. 10f, a portion of surface 246 of encapsulant 244 is removed by an etching or mechanical cutting process to form recesses or cavities 248 in encapsulant 244 around a fan-out peripheral region of semiconductor die 124. Alternatively, recess 248 can be formed by laser direct ablation (LDA) using laser 250 to remove portions of encapsulant 244, as shown in FIG. 10g.

Figure 10H:
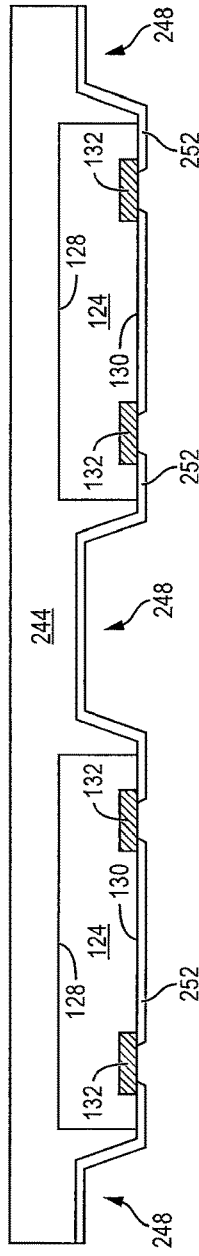

In FIG. 10h, an insulating or passivation layer 252 is conformally applied over encapsulant 244, the exposed active surface 130, and the exposed conductive layer 132 using PVD, CVD, printing, spin coating, spray coating, lamination, sintering or thermal oxidation. The insulating layer 252 contains one or more layers of SiO2, Si3N4, SiON, Ta2O5, Al2O3, or other suitable material having similar insulating and structural properties. The insulating layer 252 follows the contour of encapsulant 244, including into recesses 248. A portion of insulating layer 252 is removed by an etching process through a patterned photoresist layer to expose conductive layer 132.

Figure 10I:
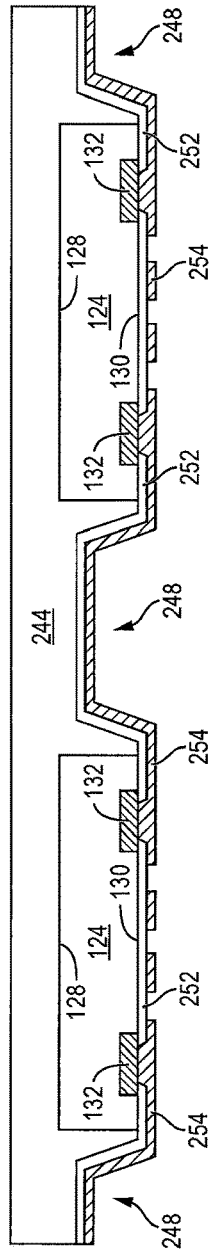

In FIG. 10i, an electrically conductive layer 254 is conformally applied over conductive layer 132 and insulating layer 252 using a patterning and metal deposition process such as printing, PVD, CVD, sputtering, electrolytic plating, and electroless plating. Conductive layer 254 can be one or more layers of Al, Cu, Sn, Ti, Ni, Au, Ag, or other suitable electrically conductive material. Conductive layer 254 follows the contour of encapsulant 244, including into recesses 248. In one embodiment, conductive layer 254 includes an adhesion layer, barrier layer, and seed or wetting layer. One portion of conductive layer 254 is electrically connected to conductive layer 132. Other portions of conductive layer 254 can be electrically common or electrically isolated depending on the design and function of semiconductor die 124.

Figure 10J:
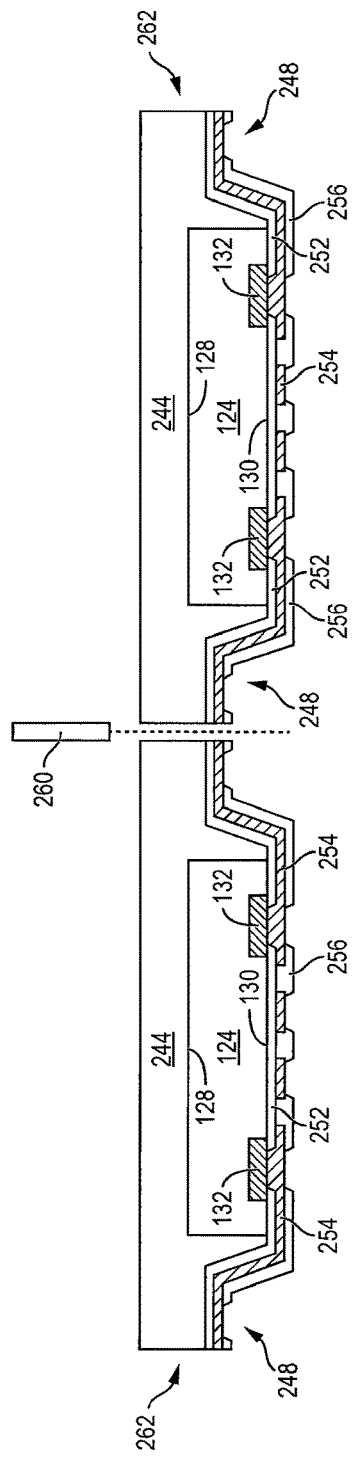

In FIG. 10j, an insulating or passivation layer 256 is conformally applied over insulating layer 252 and conductive layer 254 using PVD, CVD, printing, spin coating, spray coating, lamination, sintering or thermal oxidation. The insulating layer 256 contains one or more layers of SiO2, Si3N4, SiON, Ta2O5, Al2O3, or other suitable material having similar insulating and structural properties. The insulating layer 256 follows the contour of encapsulant 244, including into recesses 248. A portion of insulating layer 256 is removed by an etching process through a patterned photoresist layer to expose portions of conductive layer 254.

The assembly in FIG. 10j is singulated through encapsulant 244, conductive layer 254, and insulating layers 252 and 256 with saw blade or laser cutting tool 260 into individual Fo-WLSCP 262.

Figure 11A:
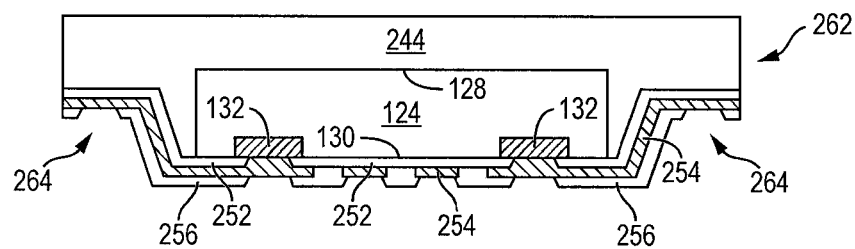
FIGS. 11a-11b illustrate the Fo-WLCSP with recessed interconnect areas in a peripheral region of the semiconductor die according to FIGS. 10a-10j.
Figure 11B:
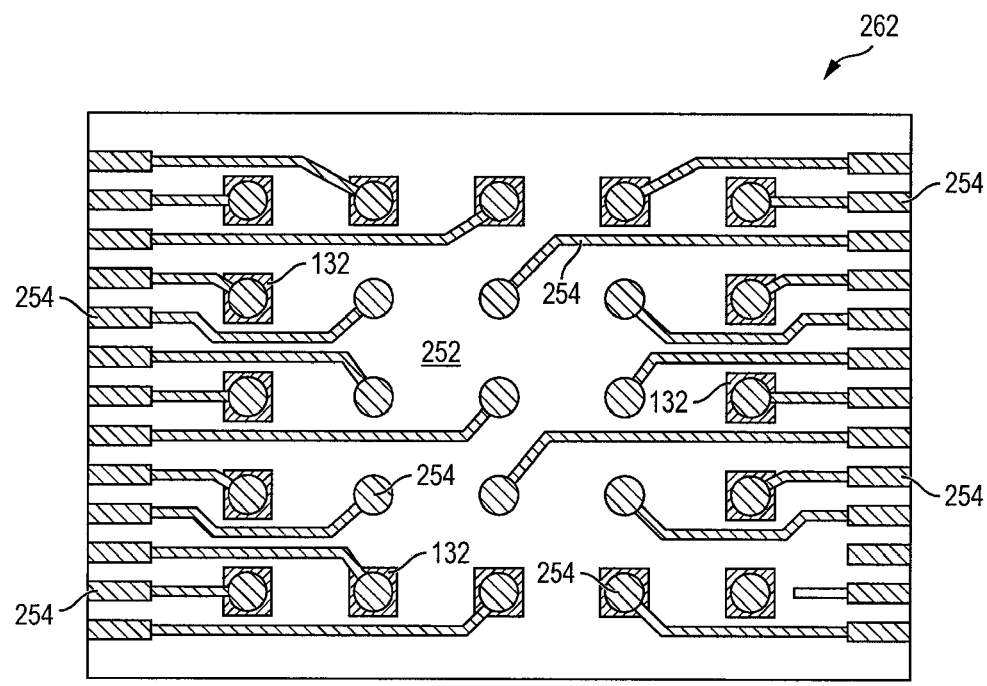

FIG. 11a shows Fo-WLCSP 262 after singulation. Semiconductor die 124 is electrically connected to conductive layer 254. The recesses 248 in encapsulant 244 provide recessed interconnect areas 264 around the fan-out peripheral region of semiconductor die 124. Conductive layer 254 in recessed interconnect areas 264 allow for connecting to bumps and bond wires to provide electrical interconnect to other semiconductor devices or substrate. Conductive layer 254 in recessed interconnect areas 264 redistributes the electrical interconnect for semiconductor die 124 while reducing the profile of Fo-WLCSP 262. Fo-WLCSP 262 remains robust during interconnect and other handling. Fo-WLCSP 262 is formed at the wafer level which reduces cost and increases manufacture through-put in terms of the UPH production schedule. FIG. 11b shows a plan view of Fo-WLCSP 262 with conductive layer 254 formed over insulating layer 252.

Figure 12:
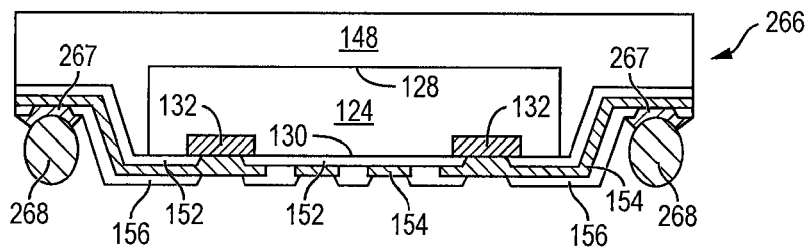
FIG. 12 illustrates the Fo-WLCSP with a UBM layer and bumps formed in the recessed interconnect areas.

FIG. 12 illustrates an embodiment of Fo-WLCSP 266, similar to FIG. 5, with under bump metallization (UBM) layer 267 formed over conductive layer 154 and insulating layer 156 within recessed interconnect areas 168. UBM layer 267 can be a multi-metal stack including an adhesion layer, barrier layer, and seed or wetting layer. The adhesion layer can be Ti, titanium nitride (TiN), titanium tungsten (TiW), Al, or chromium (Cr). The barrier layer is formed over the adhesion layer and can be made of Ni, nickel vanadium (NiV), platinum (Pt), palladium (Pd), TiW, or chromium copper (CrCu). The seed layer can be Cu, Ni, NiV, Au, or Al. The seed layer is formed over the barrier layer. UBM layer 267 provides a low resistive interconnect, as well as a barrier to solder diffusion and seed layer for solder wettability.

An electrically conductive bump material is deposited over UBM layer 267 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM layer 267 using a suitable attachment or bonding process. In one embodiment, the bump material is reflowed by heating the material above its melting point to form balls or bumps 268. In some applications, bumps 268 are reflowed a second time to improve electrical contact to UBM layer 267. Bumps 268 can also be compression bonded to UBM layer 267. Bumps 268 represent one type of interconnect structure that can be formed over UBM layer 267. The interconnect structure can also use stud bump, micro bump, or other electrical interconnect. A similar UBM layer 267 and bumps 268 can be formed on Fo-WLCSP 192 of FIG. 7a, Fo-WLCSP 220 of FIG. 9a, and Fo-WLCSP 262 of FIG. 11a.

Figure 13:
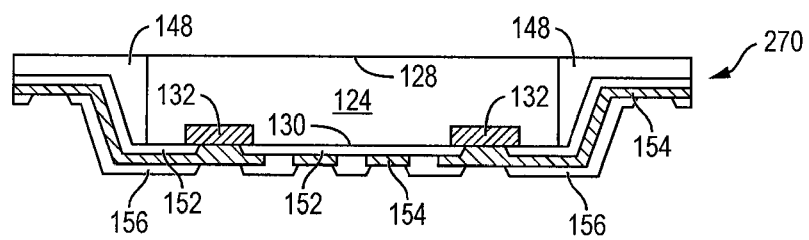
FIG. 13 illustrates the Fo-WLCSP with an exposed back surface of the semiconductor die.

FIG. 13 illustrates an embodiment of Fo-WLCSP 270, similar to FIG. 5, with back surface 128 of semiconductor die 124 exposed from encapsulant 148. A portion of encapsulant 148 is removed by an etching process or backgrinding process to expose back surface 128.

Figure 14:
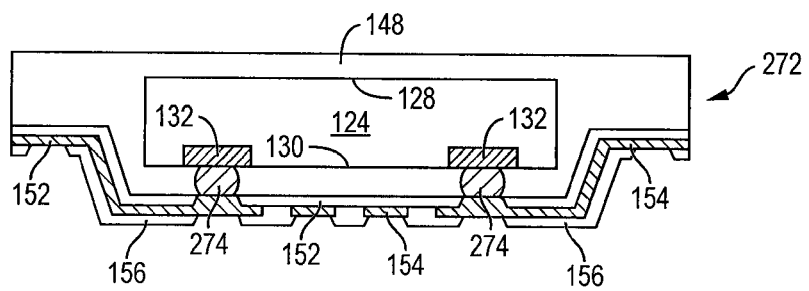
FIG. 14 illustrates the Fo-WLCSP with bumps formed on the semiconductor die.

FIG. 14 illustrates an embodiment of Fo-WLCSP 272, similar to FIG. 5, with bumps 274 formed at the wafer level over conductive layer 132. Conductive layer 154 is electrically connected to bumps 274.

Figure 15A:
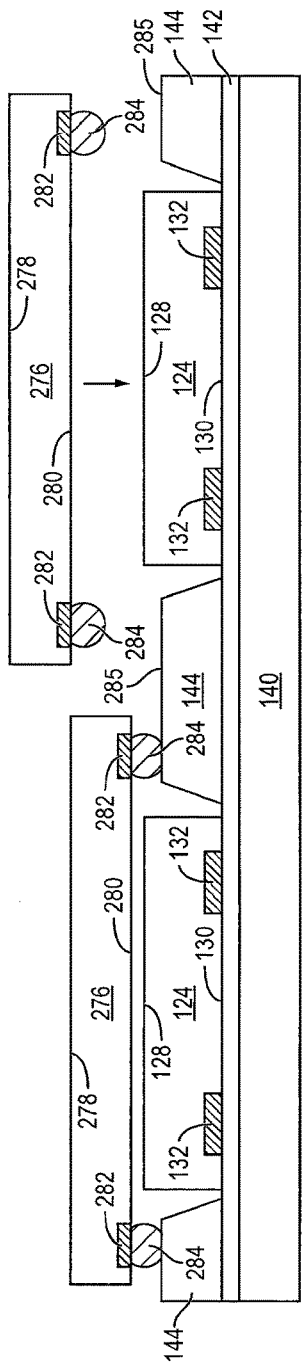
FIGS. 15a-15e illustrate a process of forming a Fo-WLCSP with recessed interconnect areas in a peripheral region of stacked semiconductor die by removing a portion of dam material.

FIGS. 15a-15e illustrate, in relation to FIGS. 1 and 2a-2c, a process of forming a Fo-WLCSP with recessed interconnect areas in a peripheral region of stacked semiconductor die by removing a portion of a dam material. Continuing from FIG. 4e, semiconductor die 276 originates from a semiconductor wafer, similar to FIGS. 3a-3c. In FIG. 15a, semiconductor die 276 has a back surface 278 and active surface 280 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 280 to implement analog circuits or digital circuits, such as DSP, ASIC, memory, or other signal processing circuit. Semiconductor die 276 may also contain IPDs, such as inductors, capacitors, and resistors, for RF signal processing. A plurality of contact pads 282 is formed over active surface 280 and electrically connected to the circuits on the active surface. A plurality of bumps 284 is formed over contact pads 282. In one embodiment, semiconductor die 276 is a flipchip type semiconductor die.

Figure 15B:
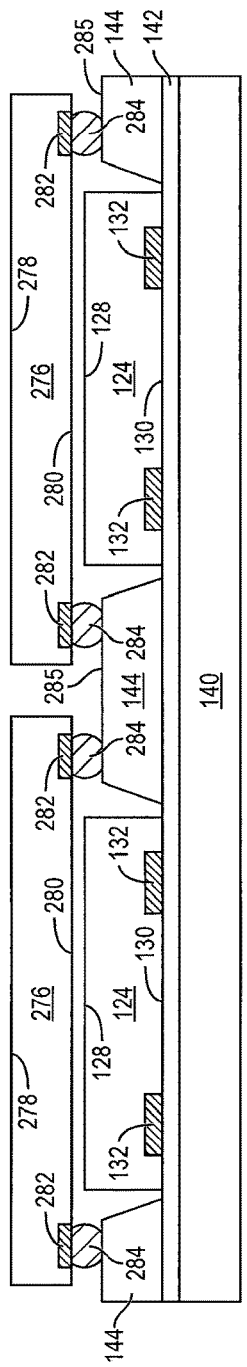

Semiconductor die 276 is positioned over and mounted to dam material 144 using a pick and place operation with active surface 280 oriented toward semiconductor die 124. FIG. 15b shows semiconductor die 276 mounted to dam material 144 with bumps 284 contacting surface 285 of the dam material.

Figure 15C:
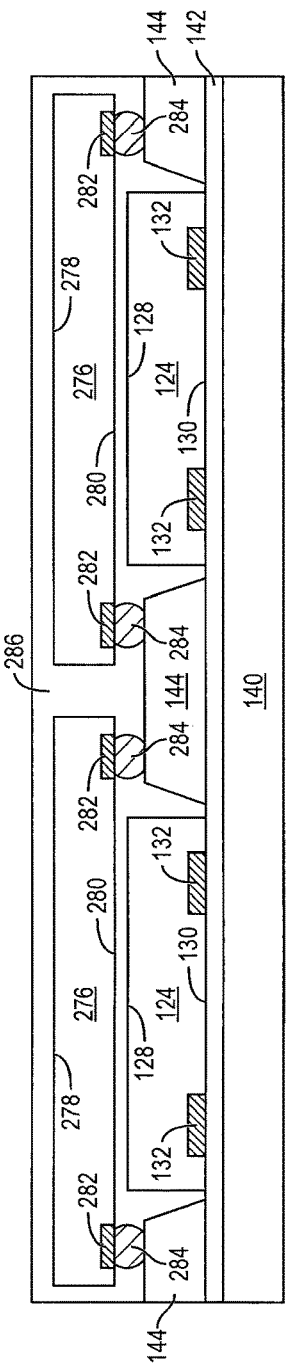

In FIG. 15c, an encapsulant or molding compound 286 is deposited over semiconductor die 124 and 276, dam material 144, and carrier 140 using a paste printing, compressive molding, transfer molding, liquid encapsulant molding, vacuum lamination, spin coating, or other suitable applicator. Encapsulant 286 can be polymer composite material, such as epoxy resin with filler, epoxy acrylate with filler, or polymer with proper filler. The width of recesses 146 is greater than a width of semiconductor die 124 so encapsulant 286 extends down to a level of active surface 130. Encapsulant 286 is non-conductive and environmentally protects the semiconductor device from external elements and contaminants.

Figure 15D:
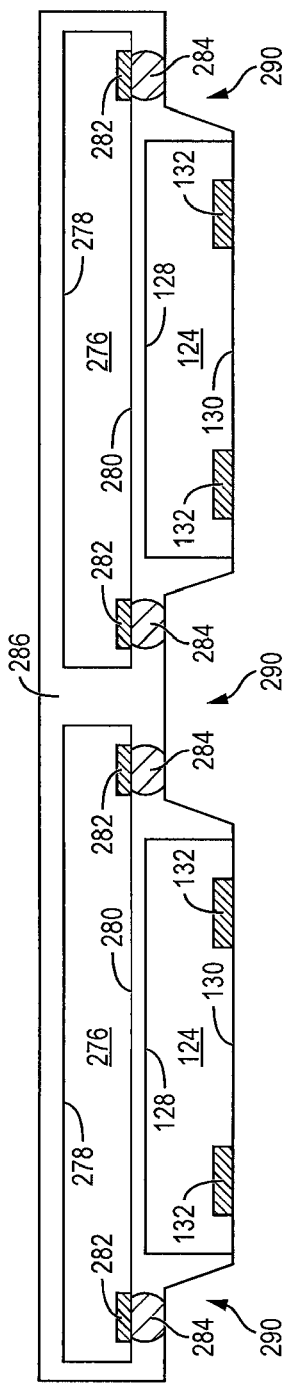

In FIG. 15d, carrier 140, interface layer 142, and dam material 144 are removed by chemical etching, mechanical peeling, CMP, mechanical grinding, thermal bake, UV light, laser scanning, or wet stripping to expose active surface 130, conductive layer 132, and encapsulant 286. The removal of dam material 148 leaves recesses or cavities 290 in encapsulant 286 around a fan-out peripheral region of semiconductor die 124.

Figure 15E:
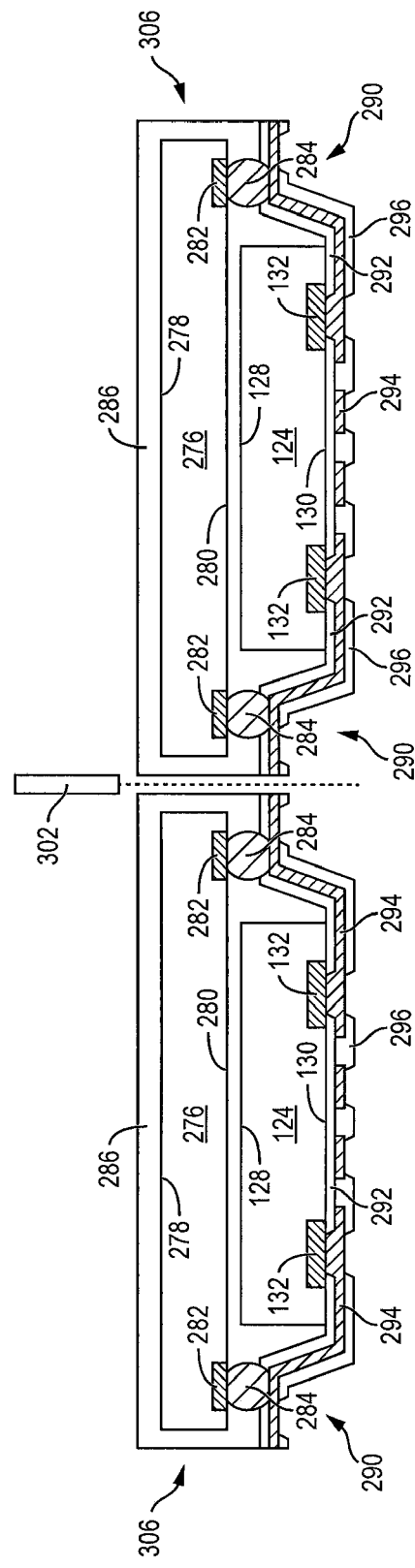

In FIG. 15e, an insulating or passivation layer 292 is conformally applied over encapsulant 286, the exposed active surface 130, and the exposed conductive layer 132 using PVD, CVD, printing, spin coating, spray coating, lamination, sintering or thermal oxidation. The insulating layer 292 contains one or more layers of SiO2, Si3N4, SiON, Ta2O5, Al2O3, or other suitable material having similar insulating and structural properties. The insulating layer 292 follows the contour of encapsulant 286, including into recesses 290. A portion of insulating layer 292 is removed by an etching process through a patterned photoresist layer to expose conductive layer 132 and bumps 284.

An electrically conductive layer 294 is conformally applied over conductive layer 132 and insulating layer 292 using a patterning and metal deposition process such as printing, PVD, CVD, sputtering, electrolytic plating, and electroless plating. Conductive layer 294 can be one or more layers of Al, Cu, Sn, Ti, Ni, Au, Ag, or other suitable electrically conductive material. Conductive layer 294 follows the contour of encapsulant 286, including into recesses 290. In one embodiment, conductive layer 294 includes an adhesion layer, barrier layer, and seed or wetting layer. One portion of conductive layer 294 is electrically connected to conductive layer 132 and bumps 284. Other portions of conductive layer 294 can be electrically common or electrically isolated depending on the design and function of semiconductor die 124 and 276.

An insulating or passivation layer 296 is conformally applied over insulating layer 292 and conductive layer 294 using PVD, CVD, printing, spin coating, spray coating, lamination, sintering or thermal oxidation. The insulating layer 296 contains one or more layers of SiO2, Si3N4, SiON, Ta2O5, Al2O3, or other suitable material having similar insulating and structural properties. The insulating layer 296 follows the contour of encapsulant 286, including into recesses 290. A portion of insulating layer 296 is removed by an etching process through a patterned photoresist layer to expose portions of conductive layer 294.

The assembly in FIG. 15e is singulated through encapsulant 286, conductive layer 294, and insulating layers 292 and 296 with saw blade or laser cutting tool 302 into individual Fo-WLSCP 306.

Figure 16:
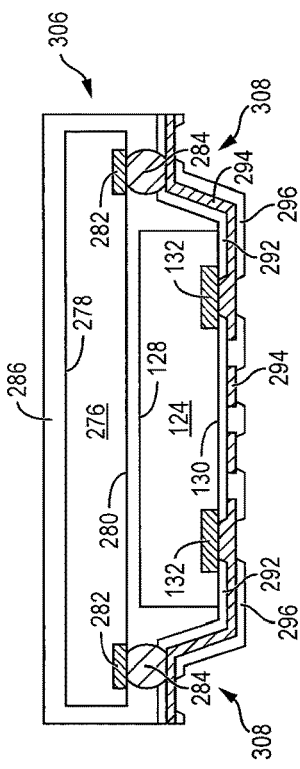
FIG. 16 illustrates the Fo-WLCSP with recessed interconnect areas in a peripheral region of stacked semiconductor die according to FIGS. 15a-15e.

FIG. 16 shows Fo-WLCSP 306 after singulation. The stacked semiconductor die 124 and 276 are electrically connected to conductive layer 294 and bumps 284. The recesses 290 in encapsulant 286 formed by removing dam material 144 provide recessed interconnect areas 308 around the fan-out peripheral region of semiconductor die 124. Conductive layer 294 in recessed interconnect areas 308 allow for bonding bumps or bond wires as electrical interconnect to other semiconductor devices or substrate. Conductive layer 294 in recessed interconnect areas 308 redistributes the electrical interconnect for the stacked semiconductor die 124 and 276 while reducing the profile of Fo-WLCSP 306. Fo-WLCSP 306 remains robust during interconnect and other handling. Fo-WLCSP 306 is formed at the wafer level which reduces cost and increases manufacture through-put in terms of the UPH production schedule. The stacked semiconductor die 124 and 276 in Fo-WLCSP 306 can also be formed by the processes shown in FIGS. 6a-6i, 8a-8i, and 10a-10j.

Figure 17A:
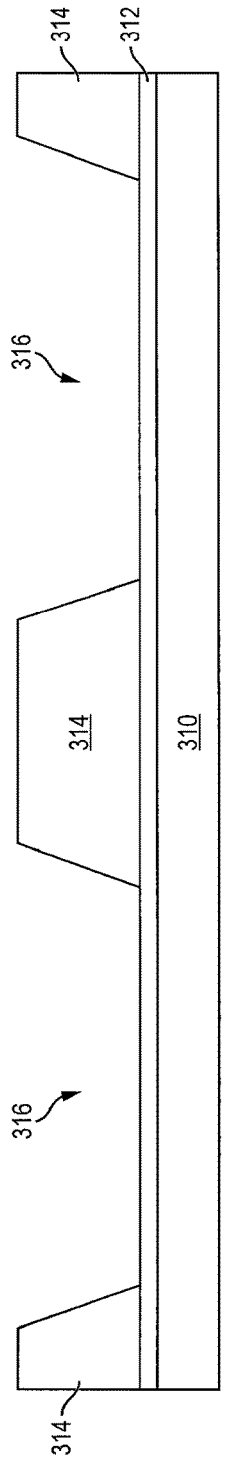

FIGS. 17a-17j illustrate, in relation to FIGS. 1 and 2a-2c, a process of forming a Fo-WLCSP with multi-step recessed interconnect areas in a peripheral region of stacked semiconductor die. FIG. 17a shows temporary carrier 310 containing a sacrificial base material such as silicon, germanium, gallium arsenide, indium phosphide, silicon carbide, resin, or other suitable low-cost, rigid material for structural support. An interface layer or double-sided adhesive tape 312 is formed over carrier 310 as a temporary adhesive bonding film or etch-stop layer.

Figure 17B:
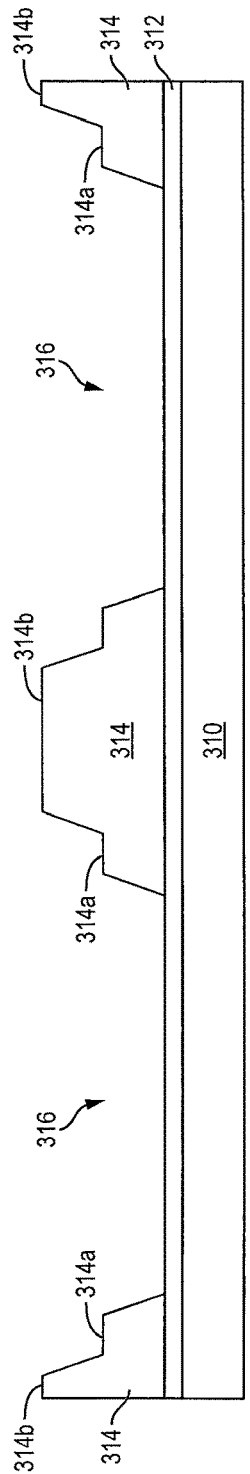

A dam material 314 is formed over interface layer 312 and carrier 310. Dam material 314 can be solder resist, adhesive, insulation, polymer, metal, or other suitable barrier material. Dam material 314 is formed by screen printing, electrolytic plating, electroless plating, spray coating, or other suitable deposition process depending on the material. In one embodiment, dam material 314 has a thickness ranging from 0.4 to 0.6 mm. A first portion of dam material 314 is removed by an etching process to form recesses or cavities 316 in the dam material which extend down to interface layer 312. In FIG. 17b, a second portion of dam material 314 is removed by an etching process to expand a width of recesses or cavities 316 and form multi-step horizontal surfaces 314a and 314b of the dam material.

In another embodiment, a first portion of dam material 314 is removed by an etching process to form recesses or cavities 318 having a first width partially through the dam material, as shown in FIG. 17c. In FIG. 17d, a second portion of dam material 314 is removed by an etching process to extend recesses or cavities 318 down to interface layer 312. The second portion of recesses 318 has a width less than the first width of the recesses to form multi-step horizontal surfaces 314a and 314b of dam material 314.

In FIG. 17e, semiconductor die 124 from FIGS. 3a-3c are positioned over and mounted within recesses 316 using a pick and place operation with active surface 130 oriented toward carrier 310. The back surface 128 of semiconductor die 124 extends above horizontal surface 314a.

In FIG. 17f, semiconductor die 320 originates from a semiconductor wafer, similar to FIGS. 3a-3c. Semiconductor die 320 has a back surface 322 and active surface 324 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 324 to implement analog circuits or digital circuits, such as DSP, ASIC, memory, or other signal processing circuit. Semiconductor die 320 may also contain IPDs, such as inductors, capacitors, and resistors, for RF signal processing. A plurality of contact pads 326 is formed over active surface 324 and electrically connected to the circuits on the active surface. A plurality of bumps 328 is formed over contact pads 326. In one embodiment, semiconductor die 320 is a flipchip type semiconductor die.

Semiconductor die 320 is positioned over and mounted to horizontal surface 314a of dam material 314 using a pick and place operation with active surface 324 oriented toward semiconductor die 124. FIG. 17g shows semiconductor die 320 mounted to horizontal surface 314a. The back surface 322 of semiconductor die 320 extends above horizontal surface 314b.

Figure 17H:
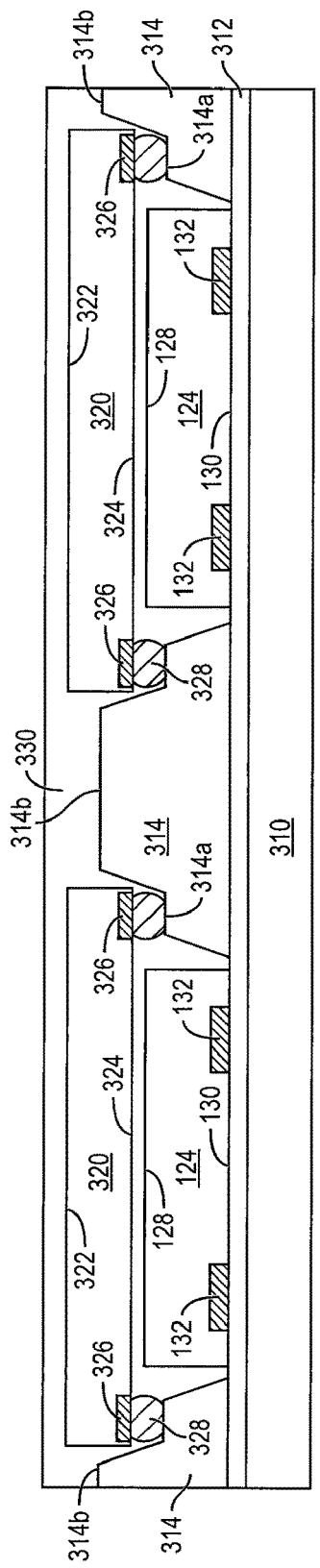

In FIG. 17h, an encapsulant or molding compound 330 is deposited over semiconductor die 124 and 320, dam material 314, and carrier 310 using a paste printing, compressive molding, transfer molding, liquid encapsulant molding, vacuum lamination, spin coating, or other suitable applicator. Encapsulant 330 can be polymer composite material, such as epoxy resin with filler, epoxy acrylate with filler, or polymer with proper filler. The multiple steps of recesses 316 is greater than a width of semiconductor die 124 and 320, respectively, so encapsulant 330 extends down to a level of active surface 130. Encapsulant 330 is non-conductive and environmentally protects the semiconductor device from external elements and contaminants.

Figure 17I:
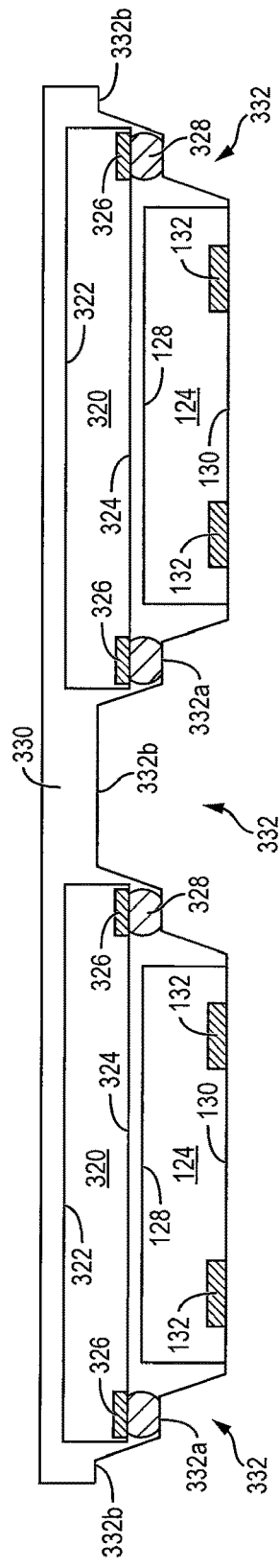

In FIG. 17i, carrier 310, interface layer 312, and dam material 314 are removed by chemical etching, mechanical peeling, CMP, mechanical grinding, thermal bake, UV light, laser scanning, or wet stripping to expose active surface 130, conductive layer 132, and encapsulant 330. The removal of dam material 314 leaves multi-step recesses or cavities 332 in encapsulant 330 with horizontal surfaces 332a and 332b around a fan-out peripheral region of semiconductor die 124.

Figure 17J:
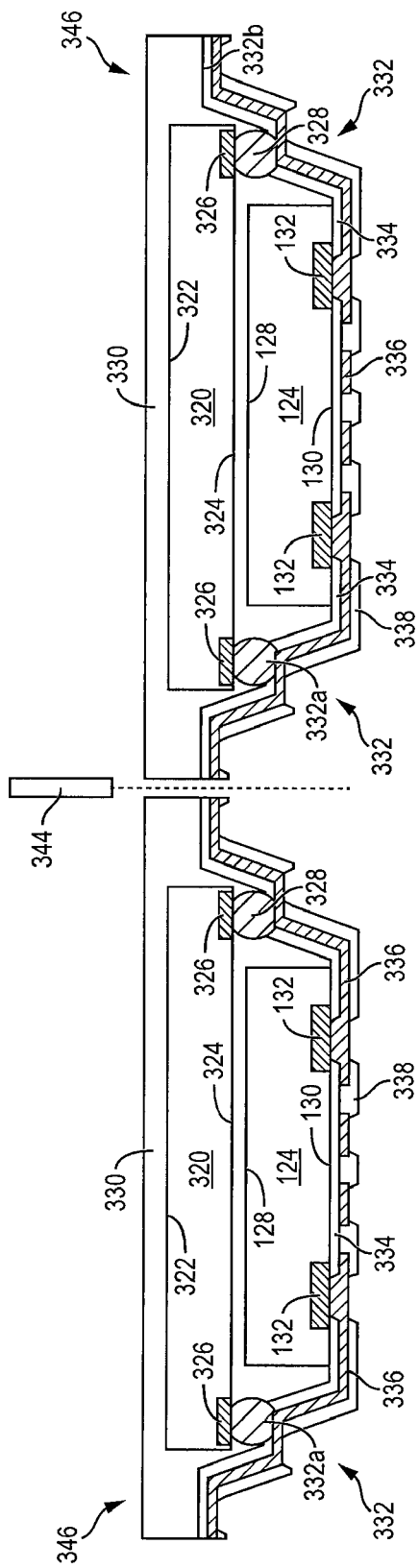

In FIG. 17j, an insulating or passivation layer 334 is conformally applied over encapsulant 330, the exposed active surface 130, and the exposed conductive layer 132 using PVD, CVD, printing, spin coating, spray coating, lamination, sintering or thermal oxidation. The insulating layer 334 contains one or more layers of SiO2, Si3N4, SiON, Ta2O5, Al2O3, or other suitable material having similar insulating and structural properties. The insulating layer 334 follows the contour of encapsulant 330, including into recesses 332. A portion of insulating layer 334 is removed by an etching process through a photoresist layer to expose conductive layer 132 and bumps 328.

An electrically conductive layer 336 is conformally applied over conductive layer 132 and insulating layer 334 using a patterning and metal deposition process such as printing, PVD, CVD, sputtering, electrolytic plating, and electroless plating. Conductive layer 336 can be one or more layers of Al, Cu, Sn, Ti, Ni, Au, Ag, or other suitable electrically conductive material. Conductive layer 336 follows the contour of encapsulant 330, including into recesses 332. In one embodiment, conductive layer 336 includes an adhesion layer, barrier layer, and seed or wetting layer. One portion of conductive layer 336 is electrically connected to conductive layer 132 and bumps 328. Other portions of conductive layer 336 can be electrically common or electrically isolated depending on the design and function of semiconductor die 124 and 320.

An insulating or passivation layer 338 is conformally applied over insulating layer 334 and conductive layer 336 using PVD, CVD, printing, spin coating, spray coating, lamination, sintering or thermal oxidation. The insulating layer 338 contains one or more layers of SiO2, Si3N4, SiON, Ta2O5, Al2O3, or other suitable material having similar insulating and structural properties. The insulating layer 338 follows the contour of encapsulant 330, including into recesses 332. A portion of insulating layer 338 is removed by an etching process through a patterned photoresist layer to expose portions of conductive layer 336.

The assembly in FIG. 17j is singulated through encapsulant 330, conductive layer 336, and insulating layers 334 and 338 with saw blade or laser cutting tool 344 into individual Fo-WLSCP 346.

Figure 18:
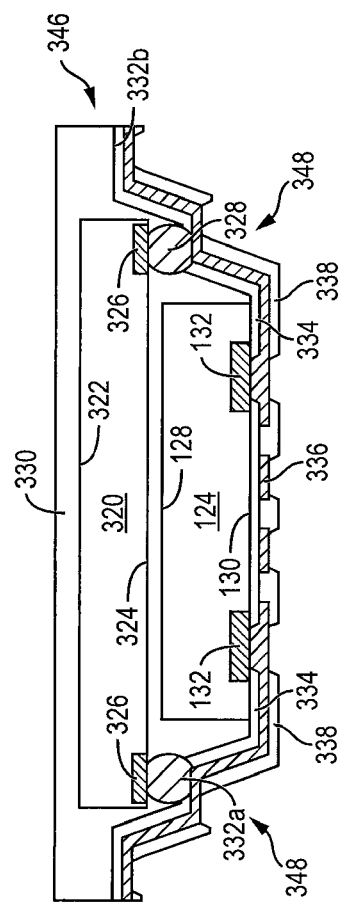
FIG. 18 illustrates the Fo-WLCSP with multi-step recessed interconnect areas in a peripheral region of stacked semiconductor die according to FIGS. 17a-17j.

FIG. 18 shows Fo-WLCSP 346 after singulation. The stacked semiconductor die 124 and 320 are electrically connected to conductive layer 336 and bumps 328. The recesses 332 in encapsulant 330 formed by removing dam material 314 provide recessed interconnect areas 348 around the fan-out peripheral region of semiconductor die 124. Conductive layer 336 in recessed interconnect areas 348 allow for bonding bumps or bond wires as electrical interconnect to other semiconductor devices or substrate. Conductive layer 336 in recessed interconnect areas 348 redistributes the electrical interconnect for the stacked semiconductor die 124 and 320 while reducing the profile of Fo-WLCSP 346. Fo-WLCSP 346 remains robust during interconnect and other handling. Fo-WLCSP 346 is formed at the wafer level which reduces cost and increases manufacture through-put in terms of the UPH production schedule. The stacked semiconductor die 124 and 320 in Fo-WLCSP 346 can also be formed by the processes shown in FIGS. 6a-6i, 8a-8i, and 10a-10j.

Figure 19:
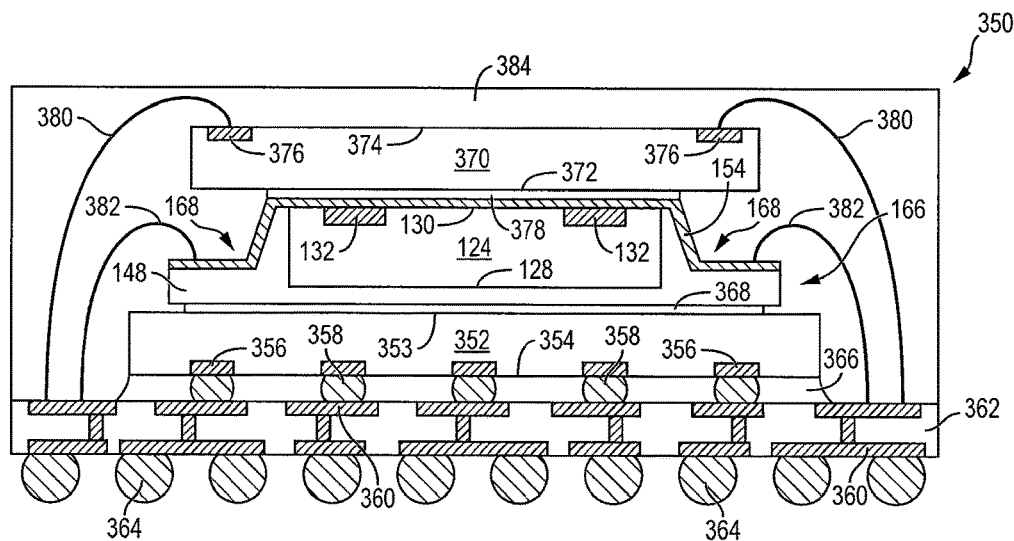
FIG. 19 illustrates the Fo-WLCSP as an ISM in a PiP arrangement.

FIG. 19 illustrates an embodiment of semiconductor package-in-package (PiP) 350. Semiconductor die 352 originates from a semiconductor wafer, similar to FIGS. 3a-3c. Semiconductor die 352 has a back surface 353 and active surface 354 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 354 to implement analog circuits or digital circuits, such as DSP, ASIC, memory, or other signal processing circuit. Semiconductor die 352 may also contain IPDs, such as inductors, capacitors, and resistors, for RF signal processing. A plurality of contact pads 356 is formed over active surface 354 and electrically connected to the circuits on the active surface. A plurality of bumps 358 is formed over contact pads 356. In one embodiment, semiconductor die 352 is a flipchip type semiconductor die.

Semiconductor die 352 is positioned over and mounted to conductive traces 360 of substrate 362 by reflowing bumps 358. A plurality of bumps 364 is formed over conductive traces 360 of substrate 362 opposite semiconductor die 352. An underfill material 366 can be deposited between semiconductor die 352 and substrate 362 around bumps 358.

Fo-WLCSP 166 from FIG. 5, shown with conductive layer 154, is mounted to semiconductor die 352 with encapsulant 148 bonded to back surface 353 using adhesive layer 368. Alternatively, Fo-WLCSP 192 from FIG. 7a, Fo-WLCSP 220 from FIG. 9a, Fo-WLCSP 262 from FIG. 11a, Fo-WLCSP 306 from FIG. 16, or Fo-WLCSP 346 from FIG. 18 can be mounted to semiconductor die 352.

Semiconductor die 370 originates from a semiconductor wafer, similar to FIGS. 3a-3c. Semiconductor die 370 has a back surface 372 and active surface 374 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 374 to implement analog circuits or digital circuits, such as DSP, ASIC, memory, or other signal processing circuit. Semiconductor die 370 may also contain IPDs, such as inductors, capacitors, and resistors, for RF signal processing. A plurality of contact pads 376 is formed over active surface 374 and electrically connected to the circuits on the active surface.

Semiconductor die 370 is mounted back surface 372 to Fo-WLCSP 166 with adhesive layer 378. Bond wires 380 are formed between contact pads 376 and conductive traces 360 of substrate 362. Bond wires 382 are formed between conductive layer 154 of Fo-WLCSP 166 and conductive traces 360 of substrate 362.

An encapsulant or molding compound 384 is deposited over semiconductor die 352 and 370, Fo-WLCSP 166, bond wires 380 and 382, and substrate 362 using a paste printing, compressive molding, transfer molding, liquid encapsulant molding, vacuum lamination, spin coating, or other suitable applicator. Encapsulant 384 can be polymer composite material, such as epoxy resin with filler, epoxy acrylate with filler, or polymer with proper filler. Encapsulant 384 is non-conductive and environmentally protects the semiconductor device from external elements and contaminants.

The thin profile of Fo-WLCSP 166 with electrical connection of bond wires 382 to conductive layer 154 in recessed interconnect areas 168 reduces the thickness of PiP 350.

Figure 20:
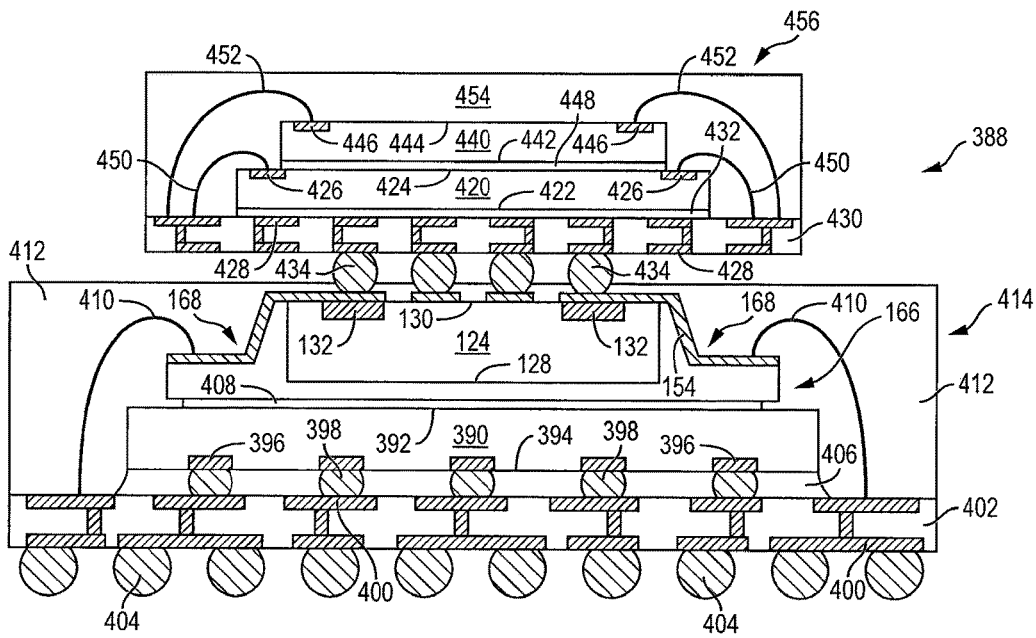
FIG. 20 illustrates the Fo-WLCSP as an ISM in a Fi-PoP arrangement.

FIG. 20 illustrates an embodiment of fan-in semiconductor package-on-package (Fi-PoP) 388 with Fo-WLCSP 166 used as an internal stacking module (ISM) in the Fi-PoP. Semiconductor die 390 originates from a semiconductor wafer, similar to FIGS. 3a-3c. Semiconductor die 390 has a back surface 392 and active surface 394 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 394 to implement analog circuits or digital circuits, such as DSP, ASIC, memory, or other signal processing circuit. Semiconductor die 390 may also contain IPDs, such as inductors, capacitors, and resistors, for RF signal processing. A plurality of contact pads 396 is formed over active surface 394 and electrically connected to the circuits on the active surface. A plurality of bumps 398 is formed over contact pads 396. In one embodiment, semiconductor die 390 is a flipchip type semiconductor die.

Semiconductor die 390 is positioned over and mounted to conductive traces 400 of substrate 402 by reflowing bumps 398. A plurality of bumps 404 is formed over conductive traces 400 of substrate 402 opposite semiconductor die 390. An underfill material 406 can be deposited between semiconductor die 390 and substrate 402 around bumps 398.

Fo-WLCSP 166 from FIG. 5, shown with conductive layer 154, is mounted to semiconductor die 390 with encapsulant 148 bonded to back surface 392 using adhesive layer 408. Alternatively, Fo-WLCSP 192 from FIG. 7a, Fo-WLCSP 220 from FIG. 9a, Fo-WLCSP 262 from FIG. 11a, Fo-WLCSP 306 from FIG. 16, or Fo-WLCSP 346 from FIG. 18 can be mounted to semiconductor die 390. Bond wires 410 are formed between conductive layer 154 of Fo-WLCSP 166 and conductive traces 400 of substrate 402.

An encapsulant or molding compound 412 is deposited over semiconductor die 390, Fo-WLCSP 166, bond wires 410, and substrate 402 using a paste printing, compressive molding, transfer molding, liquid encapsulant molding, vacuum lamination, spin coating, or other suitable applicator. Encapsulant 412 can be polymer composite material, such as epoxy resin with filler, epoxy acrylate with filler, or polymer with proper filler. Encapsulant 412 is non-conductive and environmentally protects the semiconductor device from external elements and contaminants.

Semiconductor package 414 contains semiconductor die 390 and Fo-WLCSP 166 mounted to substrate 402 and covered by encapsulant 412.

Semiconductor die 420 originates from a semiconductor wafer, similar to FIGS. 3a-3c. Semiconductor die 420 has a back surface 422 and active surface 424 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 424 to implement analog circuits or digital circuits, such as DSP, ASIC, memory, or other signal processing circuit. Semiconductor die 420 may also contain IPDs, such as inductors, capacitors, and resistors, for RF signal processing. A plurality of contact pads 426 is formed over active surface 424 and electrically connected to the circuits on the active surface.

Semiconductor die 420 is mounted back surface 422 to conductive traces 428 of substrate 430 with adhesive layer 432. A plurality of bumps 434 is formed over conductive traces 428 of substrate 430 opposite semiconductor die 420.

Semiconductor die 440 originates from a semiconductor wafer, similar to FIGS. 3a-3c. Semiconductor die 440 has a back surface 442 and active surface 444 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 444 to implement analog circuits or digital circuits, such as DSP, ASIC, memory, or other signal processing circuit. Semiconductor die 440 may also contain IPDs, such as inductors, capacitors, and resistors, for RF signal processing. A plurality of contact pads 446 is formed over active surface 444 and electrically connected to the circuits on the active surface.

Semiconductor die 440 is mounted back surface 442 to active surface 424 of semiconductor die 420 with adhesive layer 448. Bond wires 450 are formed between contact pads 426 of semiconductor die 420 and conductive traces 428 of substrate 430. Bond wires 452 are formed between contact pads 446 of semiconductor die 440 and conductive traces 428 of substrate 430.

An encapsulant or molding compound 454 is deposited over semiconductor die 420 and 440, bond wires 450 and 452, and substrate 430 using a paste printing, compressive molding, transfer molding, liquid encapsulant molding, vacuum lamination, spin coating, or other suitable applicator. Encapsulant 454 can be polymer composite material, such as epoxy resin with filler, epoxy acrylate with filler, or polymer with proper filler. Encapsulant 454 is non-conductive and environmentally protects the semiconductor device from external elements and contaminants.

Semiconductor package 456 containing stacked semiconductor die 420 and 440 mounted to substrate 430 is attached to semiconductor package 414 by reflowing bumps 434 to electrically connect conductive traces 428 to conductive layer 154 of Fo-WLCSP 166.

The thin profile of Fo-WLCSP 166 with electrical connection to conductive layer 154 in recessed interconnect area 168 reduces the thickness of Fi-PoP 388.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a first semiconductor die including an active surface, a back surface opposite the active surface, and side surfaces between the active surface and back surface;
a first encapsulant deposited in continuous contact with the back surface and side surfaces of the first semiconductor die and including a recessed interconnect area including a sidewall and horizontal portion of the first encapsulant in a peripheral region outside a footprint of the first semiconductor die, wherein the horizontal portion of the first encapsulant extends from the sidewall to an edge of the semiconductor device;
a first conductive layer formed over the first semiconductor die and first encapsulant and extending from a contact pad of the first semiconductor die along the sidewall and over the horizontal portion of the first encapsulant within the recessed interconnect area;
a second conductive layer formed over the first semiconductor die and first encapsulant and extending from an area over the active surface electrically isolated from the first semiconductor die along the sidewall and over the horizontal portion of the first encapsulant within the recessed interconnect area; and
an interconnect structure formed on the first conductive layer on the horizontal portion of the first encapsulant in the recessed interconnect area, wherein the interconnect structure is separated from a portion of the first conductive layer on the sidewall of the first encapsulant.

2. The semiconductor device of claim 1, further including a plurality of bumps formed between the contact pads of the first semiconductor die and the first conductive layer.

3. The semiconductor device of claim 1, wherein the interconnect structure includes a bump or bond wire.

4. The semiconductor device of claim 1, further including:
a second semiconductor die disposed within the first encapsulant over the first semiconductor die; and
a plurality of bumps formed between contact pads of the second semiconductor die and the first conductive layer or the second conductive layer formed over the horizontal portion of the first encapsulant within the recessed interconnect area.

5. A semiconductor device, comprising:
a first semiconductor die;
a first encapsulant deposited around side surfaces of the first semiconductor die and including a recessed interconnect area including a sidewall and horizontal portion of the first encapsulant in a peripheral region outside a footprint of the first semiconductor die, wherein the horizontal portion of the first encapsulant extends from the sidewall to an edge of the semiconductor device;
a first conductive layer formed over the first semiconductor die and first encapsulant and extending from a contact pad of the first semiconductor die along the sidewall and over the horizontal portion of the first encapsulant within the recessed interconnect area; and
a second conductive layer formed over the first semiconductor die and first encapsulant and extending from an area over the active surface electrically isolated from the first semiconductor die along the sidewall and over the horizontal portion of the first encapsulant within the recessed interconnect area.

6. The semiconductor device of claim 5, further including an interconnect structure formed on the first conductive layer on the horizontal portion of the first encapsulant in the recessed interconnect area, wherein the interconnect structure is separated from a portion of the first conductive layer on the sidewall of the first encapsulant.

7. The semiconductor device of claim 6, wherein the interconnect structure includes a bump or bond wire.

8. The semiconductor device of claim 5, further including a plurality of bumps formed between the contact pads of the first semiconductor die and the first conductive layer.

9. The semiconductor device of claim 5, further including:
a second semiconductor die disposed within the first encapsulant over the first semiconductor die; and
a plurality of bumps formed between contact pads of the second semiconductor die and the first conductive layer or the second conductive layer formed over the horizontal portion of the first encapsulant within the recessed interconnect area.

10. A semiconductor device, comprising:
a first semiconductor die;
a first encapsulant deposited around side surfaces of the first semiconductor die and including a recessed interconnect area including a sidewall and horizontal portion of the first encapsulant in a peripheral region outside a footprint of the first semiconductor die, wherein the horizontal portion of the first encapsulant extends from the sidewall to an edge of the semiconductor device;

a first conductive layer formed over the first semiconductor die and first encapsulant and extending from a contact pad of the first semiconductor die along the sidewall and over the horizontal portion of the first encapsulant within the recessed interconnect area; and an interconnect structure formed on the first conductive layer on the horizontal portion of the first encapsulant in the recessed interconnect area, wherein the interconnect structure is separated from a portion of the first conductive layer on the sidewall of the first encapsulant.

11. The semiconductor device of claim 10, further including a second conductive layer formed over the first semiconductor die and first encapsulant and extending from an area over the active surface electrically isolated from the first semiconductor die along the sidewall and over the horizontal portion of the first encapsulant within the recessed interconnect area.

12. The semiconductor device of claim 10, wherein the interconnect structure includes a bump or bond wire.

13. The semiconductor device of claim 10, further including a plurality of bumps formed between the contact pads of the first semiconductor die and the first conductive layer.

14. The semiconductor device of claim 10, further including a second semiconductor die disposed within the first encapsulant over the first semiconductor die.

15. A semiconductor device, comprising:
a first semiconductor die;
an encapsulant deposited around side surfaces of the first semiconductor die and including a recessed interconnect area including a sidewall and horizontal portion of the encapsulant in a peripheral region outside a footprint of the first semiconductor die, wherein the horizontal portion of the encapsulant extends from the sidewall to an edge of the semiconductor device; and
a first conductive layer formed over the first semiconductor die and encapsulant and extending from a contact pad of the first semiconductor die along the sidewall and over the horizontal portion of the encapsulant within the recessed interconnect area.

16. The semiconductor device of claim 15, further including a second conductive layer formed over the first semiconductor die and encapsulant and extending from an area over the active surface electrically isolated from the first semiconductor die along the sidewall and over the horizontal portion of the encapsulant within the recessed interconnect area.

17. The semiconductor device of claim 15, further including an interconnect structure formed on the first conductive layer on the horizontal portion of the encapsulant in the recessed interconnect area, wherein the interconnect structure is separated from a portion of the first conductive layer on the sidewall of the encapsulant.

18. The semiconductor device of claim 15, further including a plurality of bumps formed between the contact pads of the first semiconductor die and the first conductive layer.

19. The semiconductor device of claim 15, further including a second semiconductor die disposed within the encapsulant over the first semiconductor die.

* * * * *